United States Patent [19]
Takeuchi et al.

[11] Patent Number: 6,091,182
[45] Date of Patent: Jul. 18, 2000

[54] PIEZOELECTRIC/ELECTROSTRICTIVE ELEMENT

[75] Inventors: Yukihisa Takeuchi, Nishikamo-gun; Tsutomu Nanataki, Toyoake; Masao Takahashi, Kuwana, all of Japan

[73] Assignee: NGK Insulators, Ltd., Nagoya, Japan

[21] Appl. No.: 08/965,239

[22] Filed: Nov. 6, 1997

[30] Foreign Application Priority Data

Nov. 7, 1996 [JP] Japan .................................. 8-295160
Mar. 14, 1997 [JP] Japan .................................. 9-060667

[51] Int. Cl.$^7$ .................................................. H01L 41/08
[52] U.S. Cl. .......................... 310/330; 310/331; 310/359; 310/365; 310/324
[58] Field of Search ........................... 310/328, 330–332, 310/365, 359, 324

[56] References Cited

U.S. PATENT DOCUMENTS

| | | | |
|---|---|---|---|
| 2,565,514 | 8/1951 | Pajes | 88/61 |
| 2,997,922 | 8/1961 | Kaprelian | 88/61 |
| 3,114,849 | 12/1963 | Poschenrieder | 310/359 X |
| 3,252,017 | 5/1966 | Bartels | 310/359 X |
| 3,376,092 | 4/1968 | Kushner et al. | 350/285 |
| 3,698,793 | 10/1972 | Tellerman | 350/160 R |
| 4,113,360 | 9/1978 | Bauer et al. | 350/285 |
| 5,126,615 | 6/1992 | Takeuchi et al. | 310/332 X |
| 5,210,455 | 5/1993 | Takeuchi et al. | 310/328 |
| 5,255,016 | 10/1993 | Usui et al. | 310/330 X |
| 5,319,491 | 6/1994 | Selbrede | 359/291 |
| 5,430,344 | 7/1995 | Takeuchi et al. | 310/330 |
| 5,592,042 | 1/1997 | Takeuchi et al. | 310/330 X |
| 5,767,612 | 6/1998 | Takeuchi et al. | 310/330 X |
| 5,771,321 | 6/1998 | Stern | 385/31 |
| 5,862,275 | 1/1999 | Takeuchi et al. | 310/330 X |
| 5,953,469 | 9/1999 | Zhou | 385/22 |

FOREIGN PATENT DOCUMENTS

| | | |
|---|---|---|
| 0 165 886 | 6/1985 | European Pat. Off. . |
| 0 416 540 | 9/1990 | European Pat. Off. . |
| 0408305 | 1/1991 | European Pat. Off. . |
| 0675477 | 10/1995 | European Pat. Off. . |
| 60-087679 | 5/1985 | Japan . |
| 3128681 | 5/1991 | Japan . |
| 549270 | 2/1993 | Japan . |

*Primary Examiner*—Mark O. Budd
*Attorney, Agent, or Firm*—Wall Marjama Bilinski & Burr

[57] ABSTRACT

Disclosed is a piezoelectric/electrostrictive element composed of an actuator section of a uni-morph type comprising a main actuator element including a piezoelectric/electrostrictive layer and a pair of electrodes formed on a first principal surface of the piezoelectric/electrostrictive layer; a vibrating section which contacts with a second principal surface of the piezoelectric/electrostrictive layer for supporting the main actuator element; and a fixed section for supporting the vibrating section in a vibrative manner; wherein a relationship of y=ax is satisfied, and an expression of $1/10 \leq a \leq 100$ is satisfied provided that x represents a distance between the pair of electrodes ($1 \mu m \leq x \leq 200 \mu m$), and y represents a thickness of the piezoelectric/electrostrictive layer ($1 \mu m \leq y \leq 100 \mu m$). Accordingly, it is possible to greatly increase the relative displacement amount between the no-voltage-loaded state and the voltage-applied state and the relative displacement amount between the states in which mutually opposite electric fields are applied, making it possible to realize easy control when the element is utilized for actuators and improvement in sensitivity when the element is utilized for sensors.

11 Claims, 28 Drawing Sheets

Va : VOLTAGE TO GIVE ELECTRIC FIELD Ea (−3E)
Vg : VOLTAGE TO GIVE ELECTRIC FIELD Eg (+3E)

P : POLARIZATION DIRECTION
E : DIRECTION OF ELECTRIC FIELD

P : POLARIZATION DIRECTION
E : DIRECTION OF ELECTRIC FIELD

P : POLARIZATION DIRECTION
E : DIRECTION OF ELECTRIC FIELD

P : POLARIZATION DIRECTION
E : DIRECTION OF ELECTRIC FIELD

P : POLARIZATION DIRECTION
E : DIRECTION OF ELECTRIC FIELD

P : POLARIZATION DIRECTION
E : DIRECTION OF ELECTRIC FIELD

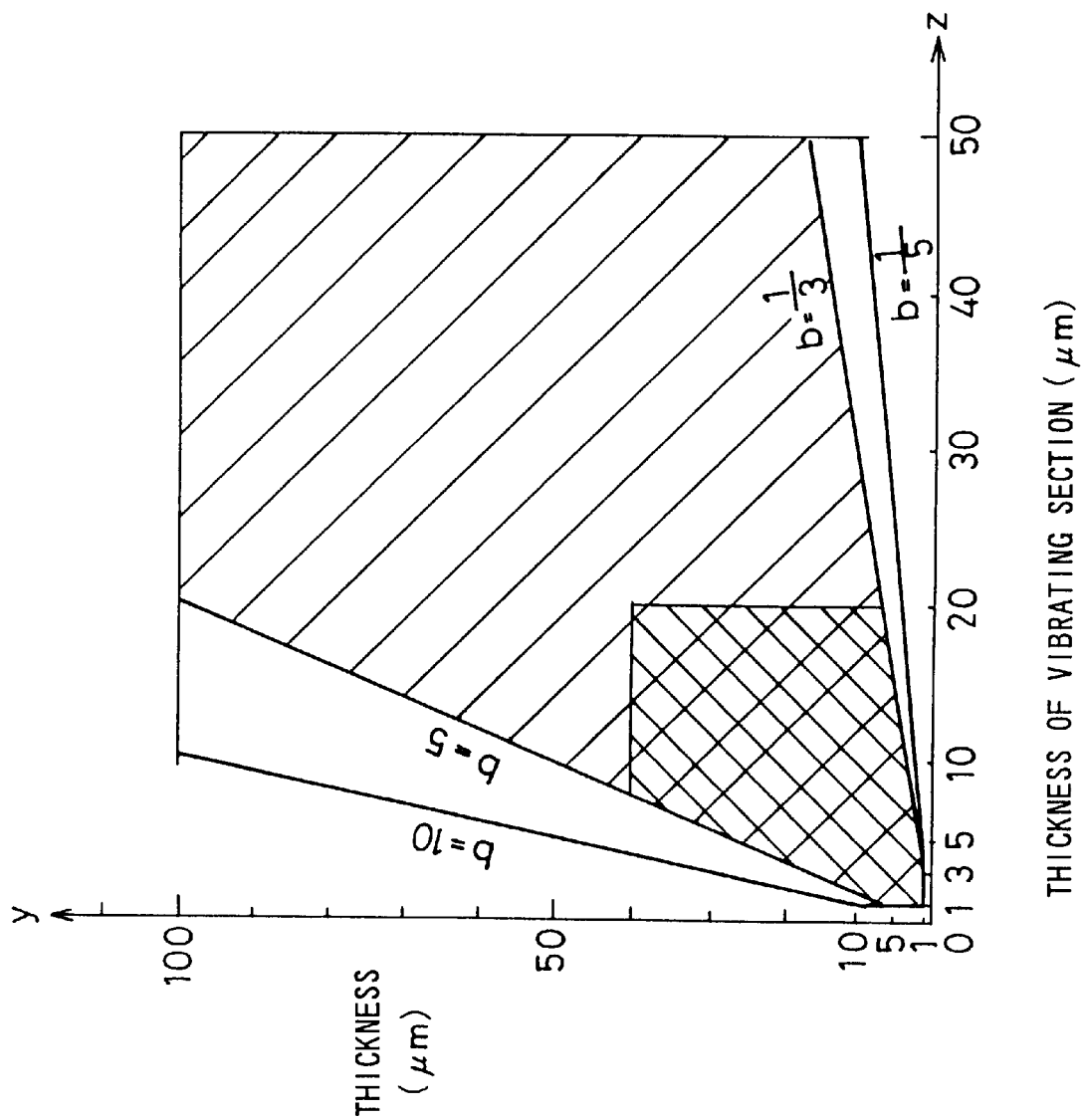

$V_a$ : VOLTAGE TO GIVE ELECTRIC FIELD $E_a$ (−3E)
$V_g$ : VOLTAGE TO GIVE ELECTRIC FIELD $E_g$ (+3E)

⇩ : POLARIZATION DIRECTION
↓ : DIRECTION OF ELECTRIC FIELD

⇩ : POLARIZATION DIRECTION
↑ : DIRECTION OF ELECTRIC FIELD

F I G. 33A Prior Art
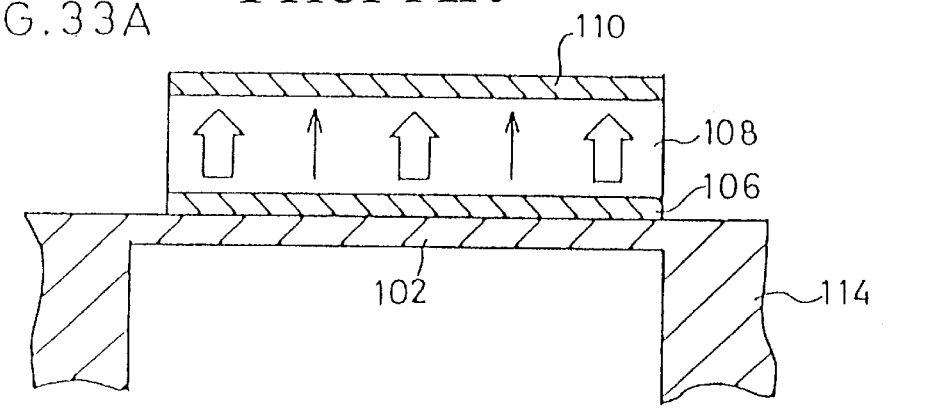
⇧ : POLARIZATION DIRECTION
↑ : DIRECTION OF ELECTRIC FIELD
F I G. 33B Prior Art
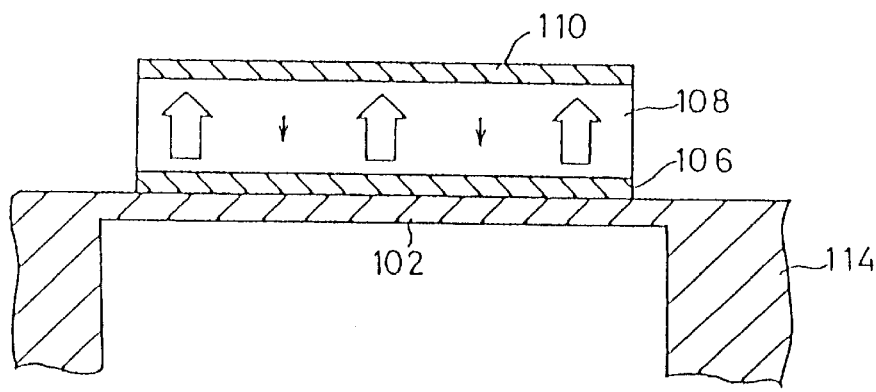
⇧ : POLARIZATION DIRECTION
↓ : DIRECTION OF ELECTRIC FIELD

PIEZOELECTRIC/ELECTROSTRICTIVE ELEMENT

BACKGROUND OF THE INVENTION

1. Field of the Invention

The present invention relates to a piezoelectric/electrostrictive element. In particular, the present invention relates to a piezoelectric/electrostrictive element of the unimorph type to be used, for example, for actuators, filters, displays, transformers, microphones, sounding bodies (such as speakers), various vibrators, resonators, oscillators, discriminators, gyroscopes, and sensors. The element referred to herein includes elements which convert electric energy into mechanical energy, i.e., into mechanical displacement, force, or vibration, as well as elements which perform conversion reversely from the latter to the former.

2. Description of the Related Art

Recently, it has been demanded, in the fields of optics, precision manufacturing, etc., to use a displacement element for adjusting the optical path length or the position on the order of submicron, and a detecting element for detecting minute displacement after converting it into an electric variation.

In order to respond to such a demand, there have been developed piezoelectric/electrostrictive elements to be used for actuators, which utilize occurrence of displacement based on the inverse piezoelectric effect caused when an electric field is applied to a piezoelectric material such as a ferroelectric substance, or for sensors which utilize a phenomenon (piezoelectric effect) reverse to the foregoing.

For example, the unimorph type piezoelectric/electrostrictive element structure has been widely used in speakers.

The applicant has also previously used piezoelectric/electrostrictive film-type elements made of ceramics in various applications, as described, for example, in Japanese Laid-Open Patent Publication Nos. 3-128681 and 5-49270.

As shown in FIG. 30, the previously proposed piezoelectric/electrostrictive film-type elements have the following structure. Namely, the element comprises a ceramic substrate 104 having at least one window (hollow space) 100 and including a thin-walled vibrating section 102 provided integrally to cover and close the window 100 so that at least one thin-walled wall section (i.e., vibrating section 102) is formed. The element further includes, on an outer surface of the vibrating section 102 of the ceramic substrate 104, a piezoelectric/electrostrictive operating section 112 comprising a combination of a lower electrode 106, a piezoelectric/electrostrictive layer 108, and an upper electrode 110, in which the piezoelectric/electrostrictive operating section 112 is integrally stacked and formed in accordance with a film-forming method. The portion of the ceramic substrate 104 other than the hollow space 100 functions as a fixed section 114 for supporting the vibrating section 102.

The previously proposed piezoelectric/electrostrictive element serves as a compact and inexpensive electromechanical conversion element with high reliability. The known piezoelectric/electrostrictive element provides a large displacement at a low driving voltage. Moreover, the response speed is quick, and the generated force is large. It is acknowledged that such a piezoelectric/electrostrictive element is useful as a constituent component of actuators, filters, displays, and sensors.

However, this piezoelectric/electrostrictive element has a so-called sandwich structure in which the piezoelectric/electrostrictive operating section 112 has an upper electrode 110 and the lower electrode 106 formed on the piezoelectric/electrostrictive layer 108. This piezoelectric/electrostrictive element comprises a piezoelectric/electrostrictive operating section 112 having the sandwich structure, a vibrating section 102, and a fixed section 114, that results in a bending displacement characteristic as shown in FIG. 31B. Namely, the bending displacement characteristic is symmetrical in positive and negative directions of the electric field in relation to a reference electric field point (point of the electric field=0) as a center.

It is assumed that the direction of the bending displacement is positive when the main piezoelectric/electrostrictive element is displaced in a convex manner in a first direction (direction for the upper electrode 110 formed on the piezoelectric/electrostrictive layer 108 to face the free space), while the direction of the bending displacement is negative when the main piezoelectric/electrostrictive element is displaced in a concave manner.

The displacement characteristic is obtained by observing the displacement of the main piezoelectric/electrostrictive element as follows. Namely, the piezoelectric/electrostrictive layer 108 is subjected to a polarization treatment by applying a predetermined voltage between the upper electrode 110 and the lower electrode 106. After that, the voltage applied between the upper electrode 110 and the lower electrode 106 is continuously changed so that the electric field applied to the piezoelectric/electrostrictive element changes, for example, to be electric fields of +3E→−3E→+3E.

At first, an electric field for polarization (for example, +5E) is applied in the positive direction to the piezoelectric/electrostrictive element to perform the polarization treatment for the piezoelectric/electrostrictive layer 108. After that, the voltage application between the upper electrode 110 and the lower electrode 106 is stopped to give a no-voltage-loaded state. Simultaneously with the start of measurement, a sine wave having a frequency of 1 Hz and peak values of ±3E (see FIG. 31A) is applied to the piezoelectric/electrostrictive element. During this process, the displacement amount is continuously measured at respective points (Point A to Point D) by using a laser displacement meter. FIG. 31B shows a characteristic curve obtained by plotting results of the measurement on a graph of electric field-bending displacement. As indicated by arrows in FIG. 31B, the displacement amount of the bending displacement continuously changes in accordance with continuous increase and decrease in electric field.

Specifically, it is assumed that the measurement is started from an electric field +3E. At first, as shown in FIG. 32A, the electric field is applied to the piezoelectric/electrostrictive element in the same direction as that of the polarization direction. Accordingly, the piezoelectric/electrostrictive layer 108 is elongated in a direction across the upper electrode 110 and the lower electrode 106, and it is contracted in a direction parallel to the upper electrode 110 and the lower electrode 106. As a result, the entire piezoelectric/electrostrictive element is displaced in the negative direction in an amount of about 0.9 Δy.

After that, when the electric field is changed from +3E to −0.5E, the displacement amount is gradually decreased. When the electric field is in the negative direction, as shown in FIG. 32B, the electric field is applied in the direction opposite to the polarization direction. Therefore, elongation occurs in the piezoelectric/electrostrictive layer 108 in the direction parallel to the upper electrode 110 and the lower electrode 106, and the displacement is changed to the positive direction.

Next, when the electric field is changed in a direction of −0.5E→−3E, the polarization direction is gradually inverted. Namely, the polarization direction is gradually aligned with the direction of the electric field. As for Point B→Point c→Point C in FIG. 31B, it is assumed that the polarization is inverted approximately completely at Point c, because no hysteresis is observed between Point c and Point C.

As shown in FIG. 33A, the alignment of the polarization direction with the direction of the electric field allows the piezoelectric/electrostrictive layer 108 to change from the state of horizontal elongation to a state of contraction. At a stage at which the electric field is −3E, the displacement amount is approximately the same as the displacement amount (0.9 Δy) obtained at the start point of the measurement.

When the polarization direction is coincident with the direction of the electric field, the piezoelectric/electrostrictive layer 108 is contracted in the direction parallel to the electrodes 110, 106 (elongated in the direction across the electrodes 110, 106). This situation corresponds to the states represented by Point A and Point C. When the polarization direction is opposite to the direction of the electric field, the piezoelectric/electrostrictive layer 108 is elongated in the direction parallel to the electrodes 110, 106 (contracted in the direction across the electrodes 110, 106). This situation corresponds to the states represented by Point B and Point D. It is noted that there are given 1E=about 1.7 kV/mm and 1 Δy=about 1.6 μm.

After that, when the electric field is changed from −3E to +0.5E, the displacement amount is gradually decreased. When the electric field is in the positive direction, as shown in FIG. 33B, the electric field is applied in the direction opposite to the polarization direction. Accordingly, elongation occurs in the piezoelectric/electrostrictive layer 108 in the direction parallel to the upper electrode 110 and the lower electrode 106, and the displacement is changed to the positive direction.

When the electric field is changed in a direction of +0.5E→+3E, the polarization direction is gradually inverted. When the polarization direction is aligned with the direction of the electric field, the piezoelectric/electrostrictive layer 108 is changed from the state of horizontal elongation to a state of contraction.

As described above, in the case of the conventional piezoelectric/electrostrictive element, the bending displacement characteristic is symmetrical in the positive and negative directions in relation to the reference electric field point (electric field E=0) as the center. Therefore, the relative displacement amount is small between the no-voltage-loaded state and the voltage-applied state, and the relative displacement amount is small between the states in which mutually opposite electric fields are applied respectively. It is feared, for example, that the displacement amount may be small when the element is utilized for actuators based on the inverse piezoelectric effect, and the sensitivity may be low when the element is utilized for sensors based on the piezoelectric effect.

Therefore, there is a possibility that when the piezoelectric/electrostrictive element is utilized for actuators, the control thereof may become difficult. When the piezoelectric/electrostrictive element is utilized for sensors, it is necessary to connect, at a downstream position thereof, an expensive amplifier having a large amplification factor provided with a considered noise suppression performance.

It is feared that the problems as described above may be extremely disadvantageous especially in the case of production of electronic instruments in each of which a large number of main piezoelectric/electrostrictive elements are used, and it is necessary to maintain a constant quality of each of the piezoelectric/electrostrictive elements, for example, in the case of production of display devices each of which comprises a large number of main piezoelectric/electrostrictive elements arranged corresponding to picture elements (image pixel).

SUMMARY OF THE INVENTION

The present invention has been made taking such problems into consideration, an object of the present invention is to provide a piezoelectric/electrostrictive element which makes it possible to greatly increase the relative displacement amount between the no-voltage-loaded state and the voltage-applied state and the relative displacement amount between the states in which mutually opposite electric fields are applied, and which makes it possible to realize easy control when the piezoelectric/electrostrictive element is utilized for actuators and improvement in sensitivity when the piezoelectric/electrostrictive element is utilized for sensors.

According to a first aspect of the present invention, in order to solve the problems as described above, there is provided a piezoelectric/electrostrictive element composed of a main piezoelectric/electrostrictive element of a unimorph type comprising a piezoelectric/electrostrictive operating section including a piezoelectric/electrostrictive layer and a pair of electrodes formed on a first principal surface of the piezoelectric/electrostrictive layer, vibrating section which contacts with a second principal surface of the piezoelectric/electrostrictive layer is provided for supporting the piezoelectric/electrostrictive operating section, fixed section is also provided for supporting the vibrating section in a vibrative manner, wherein a bending displacement characteristic of the main piezoelectric/electrostrictive element, which is obtained by applying an electric field not less than four times a predetermined electric field between the pair of electrodes, is asymmetrical in relation to a reference electric field point as a center.

The bending displacement characteristic is obtained by observing the bending displacement of the main piezoelectric/electrostrictive element when the voltage applied between the pair of electrodes is continuously changed so that the electric field applied to the piezoelectric/electrostrictive element is changed in an alternating manner. Then the piezoelectric/electrostrictive layer is subjected to a polarization treatment by applying a voltage for polarization between the pair of electrodes of the piezoelectric/electrostrictive operating section. In this case, the direction of the bending displacement is positive when the main piezoelectric/electrostrictive element is displaced in a convex manner in a first direction (direction for the pair of electrodes formed on the piezoelectric/electrostrictive layer to face the free space), while the direction of the bending displacement is negative when the main piezoelectric/electrostrictive element is displaced in a concave manner.

The predetermined electric field is herein referred to an electric field at which the direction of polarization is inverted by applying a reverse electric field at portions near to the first principal surface (front face) of the piezoelectric/electrostrictive layer.

Specifically, for example, when the predetermined voltage is applied in the positive direction between the pair of electrodes in order to perform the polarization treatment for the piezoelectric/electrostrictive layer, an electric field in the positive direction is generated in the superficial direction around the first principal surface of the piezoelectric/electrostrictive layer. The intensity of the electric field generated in the piezoelectric/electrostrictive layer is maximum at the first principal surface, and the intensity is gradually decreased in the depth direction. The piezoelectric/electrostrictive layer is subjected to the polarization treatment in the same direction as that of the electric field in accordance with the generation of the electric field in the positive direction. After that, for example, the voltage application to the pair of electrodes is stopped to establish a no-voltage-loaded state.

Subsequently, the voltage applied between the pair of electrodes is continuously changed so that the electric field applied to the piezoelectric/electrostrictive element is changed in an alternating manner. At this time, for example, at a stage in which the electric field is generated in the same direction as the direction of the electric field (for example, the positive direction) having been generated during the polarization treatment, the polarization direction of the piezoelectric/electrostrictive layer is coincident with the direction of the electric field, and the electric field is intensely applied in the vicinity of the surface of the piezoelectric/electrostrictive layer. Accordingly, the piezoelectric/electrostrictive layer is elongated in the horizontal direction. Therefore, it is considered that the main piezoelectric/electrostrictive element is displaced in any of the first and second directions.

After that, the following operation is performed at a stage in which the voltage applied between the pair of electrodes is changed, and the electric field is generated in the piezoelectric/electrostrictive element in a direction opposite to the direction of the electric field during the polarization treatment.

At first, at a stage in which the electric field is weak, the polarization direction of the piezoelectric/electrostrictive layer is mutually opposite to the direction of the electric field. Hence the piezoelectric/electrostrictive layer is contracted in the horizontal direction. Accordingly, the main piezoelectric/electrostrictive element is subjected to bending displacement in the second direction. After that, when the electric field is intensified, the polarization at the surface portion of the piezoelectric/electrostrictive layer begins to make inversion. This causes a phenomenon in which the polarization direction is coincident with the direction of the electric field in the vicinity of the surface of the piezoelectric/electrostrictive layer, while the polarization direction is opposite to the direction of the electric field at deep portions in the piezoelectric/electrostrictive layer. Namely, in the piezoelectric/electrostrictive layer, there are two different polarization directions which direct opposite with each other, and the piezoelectric/electrostrictive element functions as a pseudo-bi-morph type piezoelectric/electrostrictive element.

As a result, the direction of strain at portions close to the first principal surface of the piezoelectric/electrostrictive layer is mutually opposite to the direction of strain at portions close to the vibrating section. Thus the entire piezoelectric/electrostrictive element makes displacement in a convex manner in the first direction (direction for the pair of electrodes formed on the piezoelectric/electrostrictive layer to face the free space). The displacement amount is extremely large owing to the pseudo-bi-morph type action as described above.

Especially, in the first invention, the displacement characteristic is asymmetrical in the positive and negative directions of the electric field in relation to the reference electric field point as the center. Accordingly, for example, a difference occurs in amount of bending displacement between those obtained at two peak values of a periodically changing electric field. Thus the relative displacement amount is increased between the no-voltage-loaded state and the voltage-applied state, and the relative displacement amount is increased between states in which mutually opposite electric fields are applied. Therefore, it is possible to realize easy control when the piezoelectric/electrostrictive element is utilized for actuators and improvement in sensitivity when the piezoelectric/electrostrictive element is utilized for sensors.

When the piezoelectric/electrostrictive element is utilized for actuators and sensors, it is preferable that a relationship of $A \geq 1.5B$ is satisfied. A and B represent amounts of bending displacement obtained by applying electric fields which are not less than four times two predetermined electric fields having an identical absolute value and having different directions respectively, on the basis of the reference electric field point. In accordance with the relationship, it is possible to obtain the bending displacement characteristic which is asymmetrical in relation to the reference electric field point as the center. Accordingly, it is easy to control the piezoelectric/electrostrictive element when the element is utilized in actuators. Similarly, sensitivity is improved when the piezoelectric/electrostrictive element is utilized in sensors.

Next, according to a second aspect of the present invention, there is provided a piezoelectric/electrostrictive element composed of a main piezoelectric/electrostrictive element of a uni-morph type comprising a piezoelectric/electrostrictive operating section including a piezoelectric/electrostrictive layer and a pair of electrodes formed on a first principal surface of the piezoelectric/electrostrictive layer. A vibrating section which contacts with a second principal surface of the piezoelectric/electrostrictive layer is provided for supporting the piezoelectric/electrostrictive operating section, and a fixed section for supporting the vibrating section in a vibrative manner, wherein a relationship of $y=ax$ is satisfied, and an expression of $1/10 \leq a \leq 100$ is satisfied provided that x represents a distance between the pair of electrodes (1 $\mu m \leq x \leq 200$ $\mu m$), and y represents a thickness of the piezoelectric/electrostrictive layer (1 $\mu m \leq y \leq 100$ $\mu m$).

According to this aspect of the present invention, the bending displacement characteristic of the main piezoelectric/electrostrictive element, which is obtained by applying the electric field between the pair of electrodes, lies in the bending displacement characteristic as described in the first invention. Namely, it is possible to obtain the bending displacement characteristic which is asymmetrical in relation to the reference electric field point as the center. Accordingly, as for the piezoelectric/electrostrictive element according to the second invention, it is possible to realize easy control when the piezoelectric/electrostrictive element is utilized for actuators and improvement in sensitivity when the piezoelectric/electrostrictive element is utilized for sensors, in the same manner as realized by the first invention.

It is preferable in the first and second inventions described above that the vibrating section and the fixed section are formed with ceramics in an integrated manner, and a hollow space is formed at a portion corresponding to the vibrating section so that the vibrating section is thin-walled. By doing so, it is possible to easily produce the fixed section and the vibrating section, which is advantageous in order to reduce the production cost of the piezoelectric/electrostrictive element.

The piezoelectric/electrostrictive element is constructed such that the thick-walled fixed section and the thin-walled vibrating section are formed by providing the hollow space in a substrate composed of ceramics. Thus the vibrating section sensitively responds to the displacement of the piezoelectric/electrostrictive layer, and the vibrating section can promptly follow any change in voltage signal. Further, the rigidity is sufficiently ensured at the boundary between the vibrating section and the fixed section. Therefore, breakage scarcely occurs due to fatigue of the boundary which would be otherwise caused by vibration of the vibrating section.

In the piezoelectric/electrostrictive element constructed as described above, it is preferable that an expression of $1/5 \leq a \leq 10$ is satisfied, and it is more preferable that an expression of $1/2 \leq a \leq 5$ is satisfied, and expressions of $1 \mu m \leq x \leq 60 \mu m$ and $1 \mu m \leq y \leq 40 \mu m$ are satisfied.

In the piezoelectric/electrostrictive element constructed as described above, it is preferable that a relationship of $y=bz$ is satisfied, and an expression of $1/5 \leq b \leq 10$ is satisfied provided that z represents a thickness of the vibrating section ($1 \mu m \leq z \leq 50 \mu m$). Thus it is possible to increase the bending displacement amount.

In the piezoelectric/electrostrictive element constructed as described above, it is preferable that an expression of $1/3 \leq b \leq 5$ is satisfied. It is more preferable that an expression of $1/3 \leq b \leq 5$ is satisfied, and expressions of $1 \mu m \leq y \leq 40 \mu m$ and $1 \mu m \leq z \leq 20 \mu m$ are satisfied.

In the piezoelectric/electrostrictive element constructed as described above, it is preferable that the vibrating section has a cross-sectional configuration corresponding to a shortest dimension m passing through a center of the vibrating section, and the cross-sectional configuration satisfies the following conditions (1) to (3) in the no-voltage-loaded state. By doing so, the bending displacement characteristic of the main piezoelectric/electrostrictive element, which is obtained by applying the electric field between the pair of electrodes, is asymmetrical in relation to the reference electric field point as the center. Accordingly, it is possible to realize easy control when the piezoelectric/electrostrictive element is utilized for actuators and improvement in sensitivity when the piezoelectric/electrostrictive element is utilized for sensors, in the same manner as realized by the piezoelectric/electrostrictive element according to the first invention. Further, it is possible to allow the produced main piezoelectric/electrostrictive element to make large bending displacement in the first direction without any fail, making it possible to achieve improvement in yield when the piezoelectric/electrostrictive element is used for various electronic instruments.

Conditions:

(1) At least a part of the upper surface of the piezoelectric/electrostrictive layer in the vicinity of its center makes a protrusion in a direction directed oppositely to the vibrating section from a reference line formed by connecting one outermost local minimum point and the other outermost local minimum point adjacent to the fixed section.

(2) When the outermost local minimum point as described above is not present, the outermost local minimum point is regarded to be a point included in the upper surface of the vibrating section along the minimum dimension m and corresponding to a boundary point between the fixed section and the vibrating section.

(3) Assuming that a boundary between the vibrating section and the fixed section is a zero position, and a length of shortest dimension m of the vibrating section is 100%, when the outermost local minimum point is absent in a range of 40% of the length of shortest dimension m of the vibrating section starting from the zero position, then the outermost local minimum point is regarded to be the point included in the upper surface of the vibrating section along the minimum dimension m and corresponding to the boundary point between the fixed section and the vibrating section.

Especially, in the present invention, it is more preferable that t that satisfies $m/1000 \leq t \leq m/10$.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 16 shows characteristic curves illustrating a dimensional relationship between the thickness of the piezoelectric/electrostrictive layer and the thickness of the vibrating section of the piezoelectric/electrostrictive element according to the embodiment of the present invention.

FIG. 33A explanatorily shows a polarization direction and a direction of an electric field obtained in a state in which the electric field (−3E) is applied in the negative direction to the illustrative conventional piezoelectric/electrostrictive element.

FIG. 33B explanatorily shows a polarization direction and a direction of an electric field obtained in a state in which the predetermined electric field (+0.5E) in the positive direction is applied to the piezoelectric/electrostrictive element.

DESCRIPTION OF THE PREFERRED EMBODIMENTS

Illustrative embodiments of the piezoelectric/electrostrictive element according to the present invention (hereinafter referred to as "piezoelectric/electrostrictive element according to the embodiment of the present invention") will be explained below with reference to FIGS. 1 to 19. Further, embodiments, in which the piezoelectric/electrostrictive element according to the embodiment of the present invention is applied to a display device (hereinafter referred to as "display device according to the embodiment"), will be explained with reference to FIGS. 20 to 29.

Figure 1:
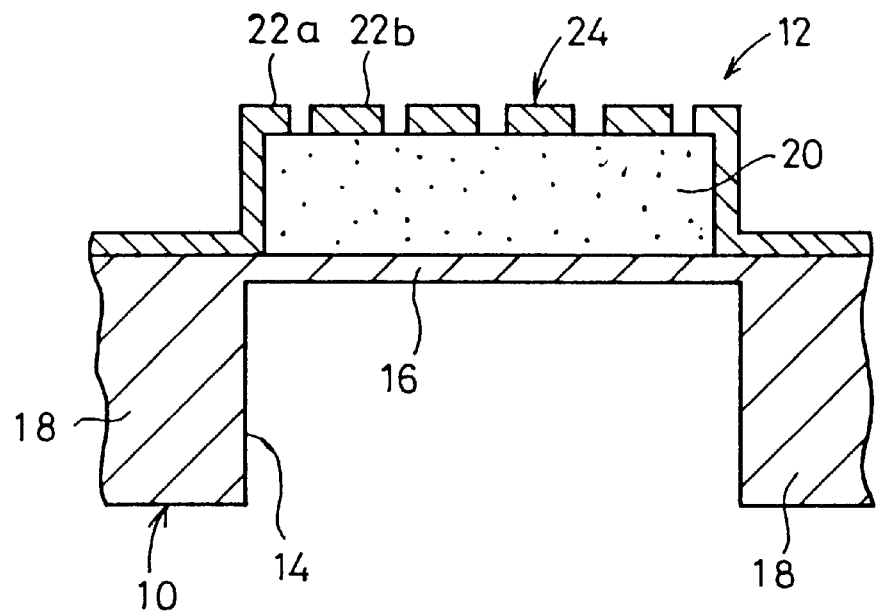
FIG. 1 shows a cross-sectional view illustrating a piezoelectric/electrostrictive element according to an embodiment of the present invention.

At first, as shown in FIG. 1, the piezoelectric/electrostrictive element according to the embodiment of the present invention has a substrate 10 composed of, for example, a ceramic. An actuator element 12 is arranged at a predetermined position on the substrate 10. The substrate 10 has a first principal surface which is a continuous surface (flushed surface), and a second principal surface in which a recess 14 is formed at a position corresponding to the actuator element 12.

Namely, a portion of the substrate 10, at which the recess 14 is formed, is thin-walled. The other portion of the substrate 10 is thick-walled. The thin-walled portion has a structure which tends to undergo vibration in response to an external stress, and thus it functions as a vibrating section 16. The portion other than the recess 14 is thick-walled, and it functions as a fixed section 18 for supporting the vibrating section 16. Although not shown, a substrate for wiring is stuck on the second principal surface of the substrate 10. The substrate 10 may be produced either by integrated sintering or by additional attachment.

As shown in FIG. 1, the actuator element 12 comprises the vibrating section 16 and the fixed section 18 as described above. The actuator element 12 further comprises a main actuator element 24 including a piezoelectric/electrostrictive layer 20 formed directly on the vibrating section 16, and a pair of electrodes (a first electrode 22a and a second electrode 22b) formed on an upper surface of the piezoelectric/electrostrictive layer 20.

Figure 3:
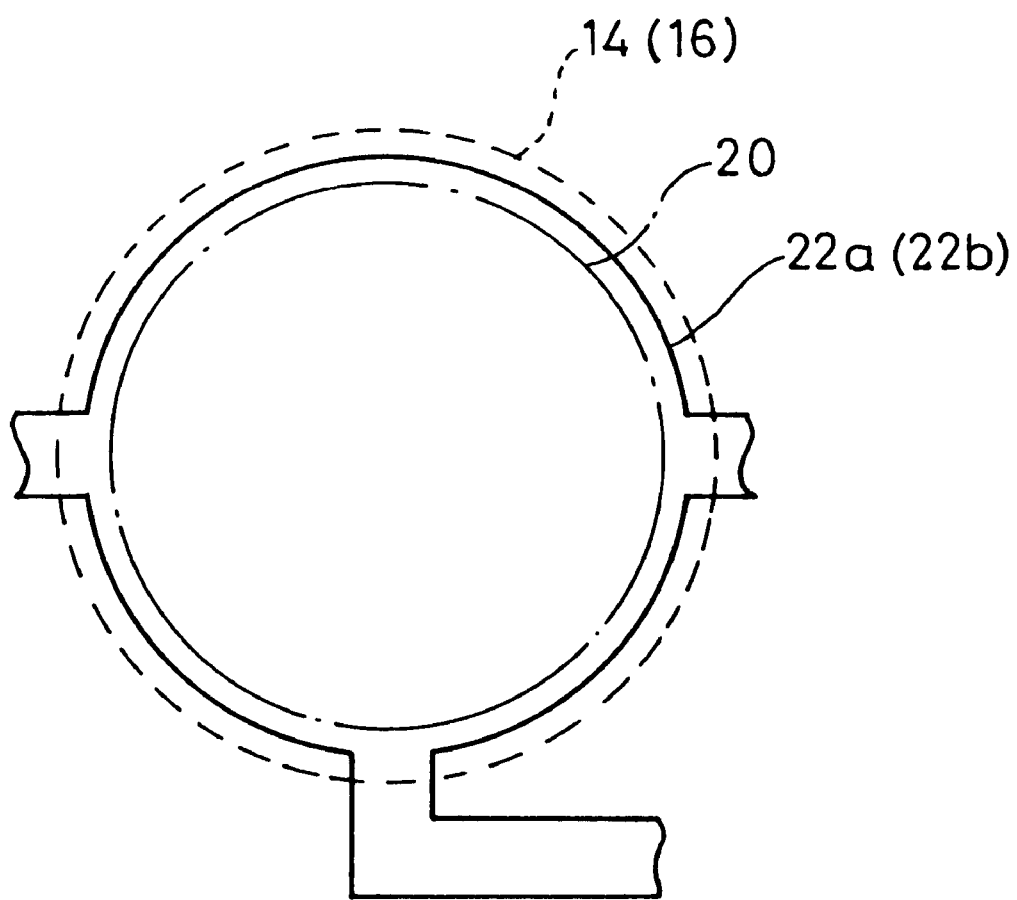
FIG. 3 shows a plan view illustrating a planar configuration of a vibrating section for constructing a main actuator element of the piezoelectric/electrostrictive element according to the embodiment of the present invention, a planar configuration of a piezoelectric/electrostrictive layer, and an outer circumferential configuration formed by a pair of electrodes.

Now, shapes of the respective members will be explained with reference to FIGS. 3 to 19. At first, as shown in FIG. 3, the recess 14, which is formed in the second principal surface of the substrate 10, has a circumferential surface, for example, having a circular planar configuration. Namely, the vibrating section 16 has, for example, a circular planar configuration (see broken lines). The piezoelectric/electrostrictive layer 20 also has a circular planar configuration (see chain lines). The pair of electrodes 22a, 22b form an outer circumferential configuration which is circular as well (see solid lines). In this embodiment, the vibrating section 16 is designed to have the largest size. The outer circumferential configuration of the pair of electrodes 22a, 22b is designed to have the second largest size. The planar configuration of piezoelectric/electrostrictive layer 20 is designed to have the smallest size. Alternatively, it is allowable to make design so that the outer circumferential configuration of the pair of electrodes 22a, 22b is largest.

Figure 4:
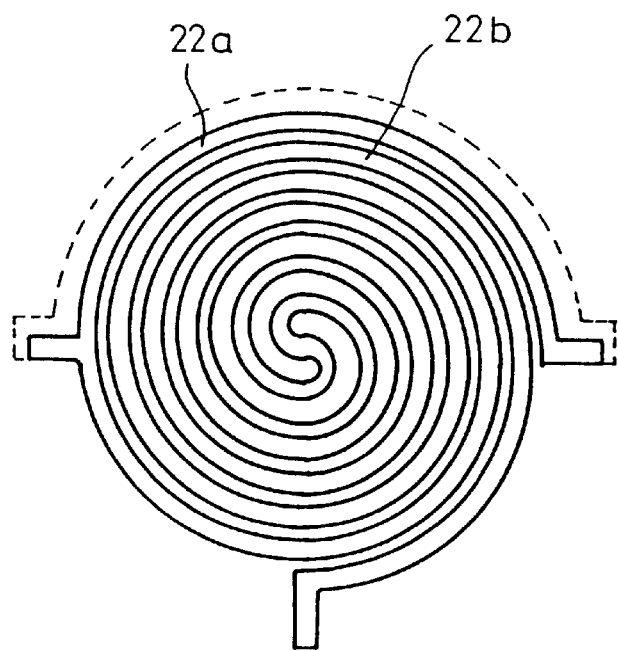
FIG. 4 shows a plan view illustrating a planar configuration (spiral configuration) of a pair of electrodes formed on the piezoelectric/electrostrictive layer of the piezoelectric/electrostrictive element according to the embodiment of the present invention.

The pair of electrodes 22a, 22b formed on the piezoelectric/electrostrictive layer 20 have, for example, a spiral planar configuration as shown in FIG. 4, in which the pair of electrodes 22a, 22b are parallel to one another and separated from each other to form a spiral structure composed of several turns. The number of turns of the spiral is actually not less than 5 turns. However, FIG. 4 illustratively shows 3 turns in order to avoid complicated illustration.

Figure 5:
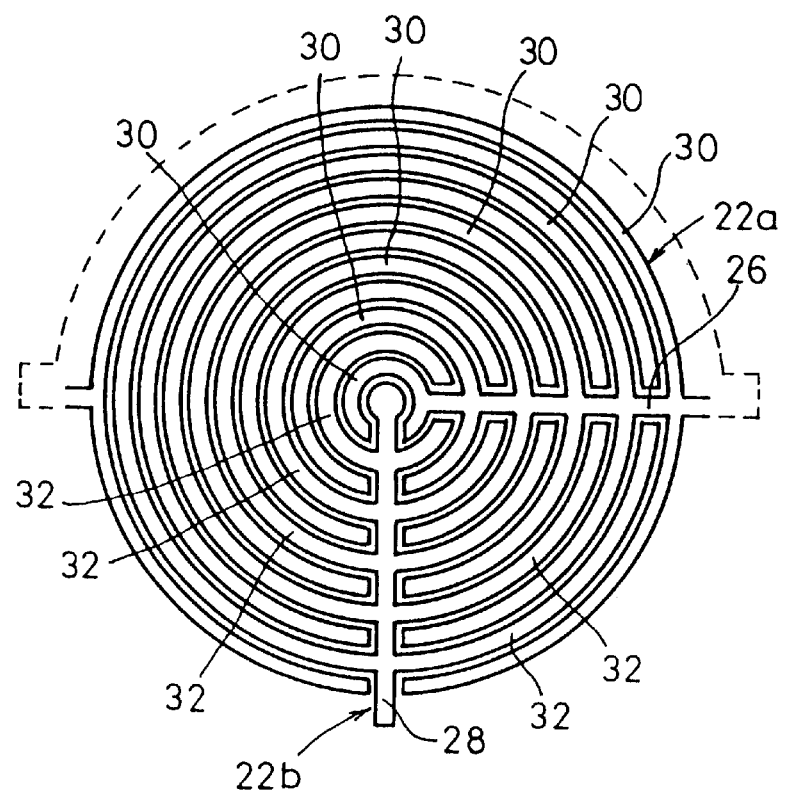
FIG. 5 shows a plan view illustrating a planar configuration (branched configuration) of a pair of electrodes formed on the piezoelectric/electrostrictive layer of the piezoelectric/electrostrictive element according to the embodiment of the present invention.

The planar configuration of the pair of electrodes 22a, 22b is not limited to the spiral configuration as shown in FIG. 4. The planar configuration may be a configuration as shown in FIG. 5. Specifically, each of the pair of electrodes 22a, 22b has a configuration composed of a trunk 26, 28 which extends toward the center of the piezoelectric/electrostrictive layer 20, and a lot of branches 30, 32 branched from the trunk 26, 28. In this configuration, the pair of electrodes 22a, 22b are separated from each other and arranged complementarily (hereinafter referred to as "branched configuration" for convenience).

The foregoing embodiment has been explained as one having the circular planar configuration of the vibrating section 16, the circular planar configuration of the piezoelectric/electrostrictive layer 20, and the circular outer circumferential configuration formed by the pair of electrodes 22a, 22b. Alternatively, those usable as the planar configurations and the outer circumferential configuration include oblong configurations (see FIGS. 22 and 23), and an elliptic configuration (see FIG. 24). Further alternatively, both of the planar configuration of the vibrating section 16 and the planar configuration of the piezoelectric/electrostrictive layer 20 may be rectangular configurations with smoothed corners (see FIG. 25). Further alternatively, both of the planar configuration of the vibrating section 16 and the planar configuration of the piezoelectric/electrostrictive layer 20 may be polygonal configurations (for example, octagonal configurations in an embodiment shown in FIG. 26) with respective apex angle portions having rounded shapes.

The configuration of the vibrating section 16, the planar configuration of the piezoelectric/electrostrictive layer 20, and the outer circumferential configuration formed by the pair of electrodes 22a, 22b may be combinations of circular and elliptic configurations, or combinations of rectangular and elliptic configurations, without any special limitation.

Figure 6:
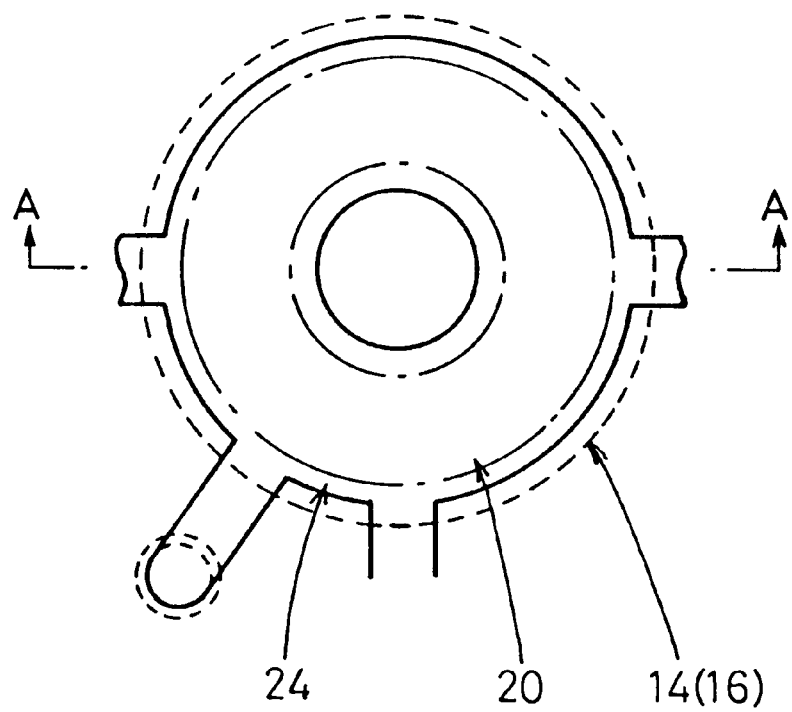
FIG. 6 schematically shows a plan view illustrating a ring-shaped piezoelectric/electrostrictive layer of the actuator element of a display device according to the embodiment of the present invention.
Figure 7:
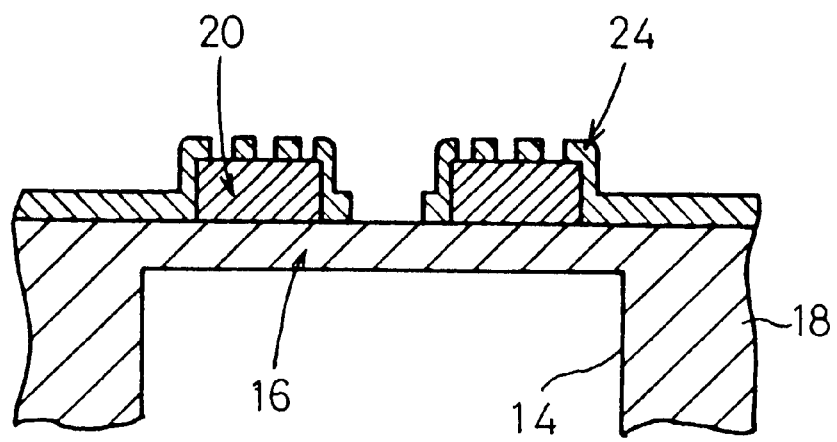
FIG. 7 shows a cross-sectional view taken along a line A—A in FIG. 6.
Figure 8:
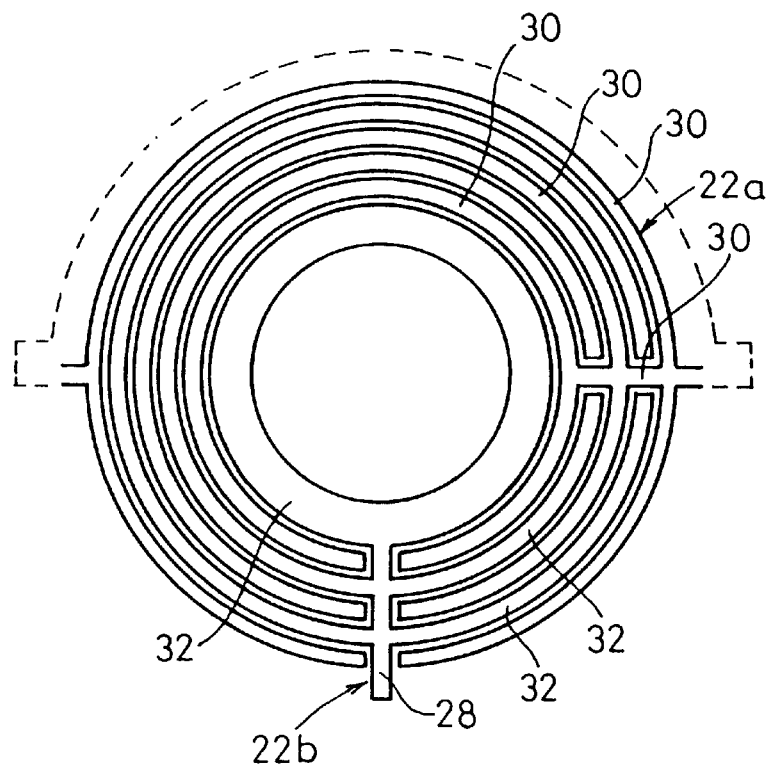
FIG. 8 shows a plan view illustrating a piezoelectric/electrostrictive layer having a ring-shaped planar configuration and a pair of electrodes having a branched configuration, of the actuator element of the display device according to the embodiment of the present invention.
Figure 9A:
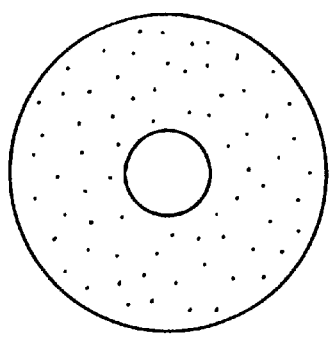
FIG. 9A shows a plan view illustrating a ring-shaped piezoelectric/electrostrictive layer having a circular outer circumferential configuration.
Figure 9B:
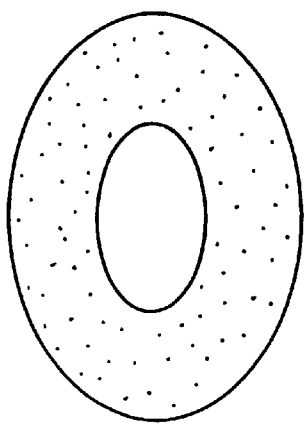
FIG. 9B shows a plan view illustrating a ring-shaped piezoelectric/electrostrictive layer having an elliptic outer circumferential configuration.
Figure 9C:
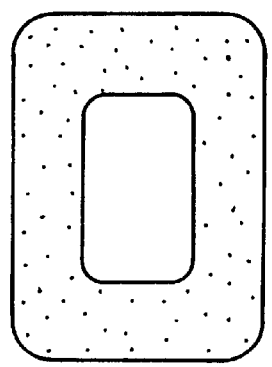
FIG. 9C shows a plan view illustrating a ring-shaped piezoelectric/electrostrictive layer having a rectangular outer circumferential configuration.

As shown in FIGS. 6 and 7, those preferably adopted as the planar configuration of the piezoelectric/electrostrictive layer 20 include a ring-shaped (hollow) configuration. In this case, as shown in FIGS. 9A to 9C, those usable as the outer circumferential configuration include various ones such as circular, elliptic, and rectangular configurations. FIG. 8 shows an illustrative arrangement in which the planar configuration of the piezoelectric/electrostrictive layer 20 is a ring-shaped configuration, and the pair of electrodes 22a, 22b have a branched configuration.

The ring-shaped planar configuration of the piezoelectric/electrostrictive layer 20 makes it unnecessary to form any electrode on the hollow portion. Therefore, it is possible to decrease the electrostatic capacity without decreasing the displacement amount.

Next, the operation principle of the piezoelectric/electrostrictive element according to the embodiment of the present invention will be explained with reference to FIGS. 10A to 13B.

Figure 10A:
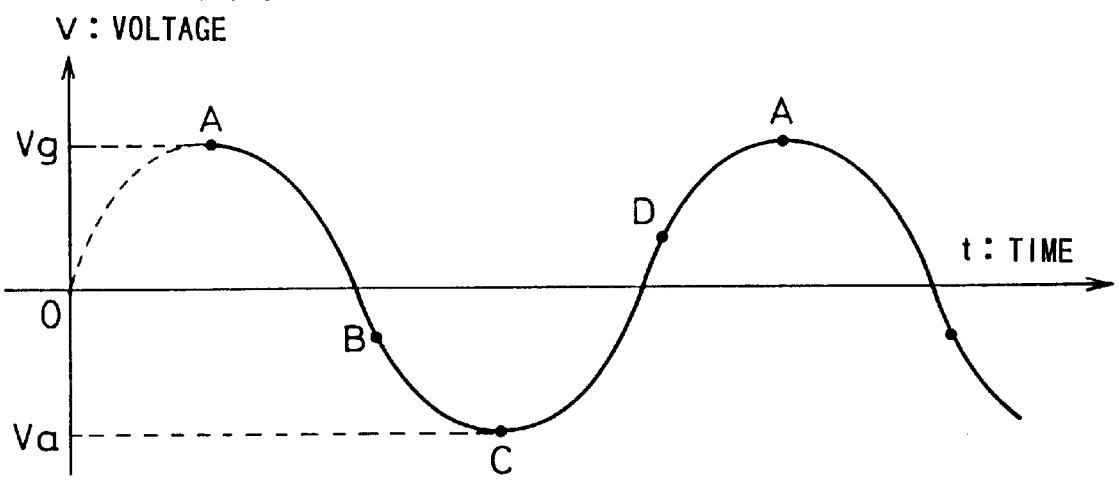
FIG. 10A shows a timing chart illustrating an electric potential waveform to be applied to the pair of electrodes in order to measure a bending displacement characteristic of the piezoelectric/electrostrictive element according to the embodiment of the present invention.
Figure 10B:
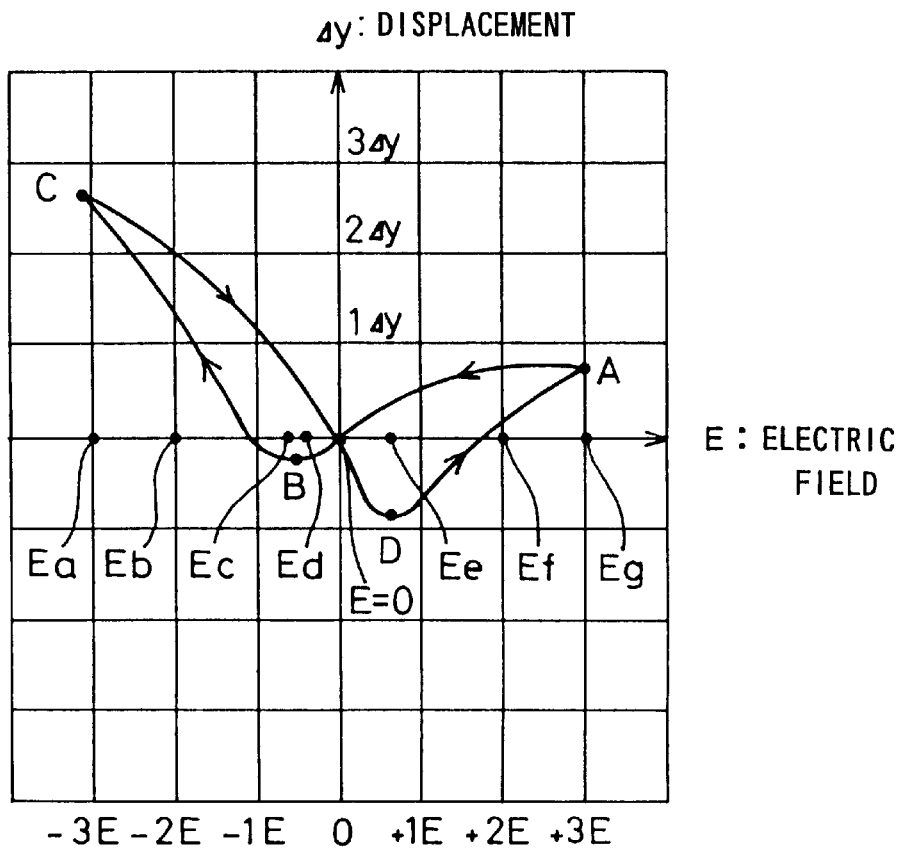
FIG. 10B shows a characteristic curve illustrating the bending displacement characteristic of the piezoelectric/electrostrictive element according to the embodiment of the present invention.

At first, the piezoelectric/electrostrictive element according to the embodiment of the present invention has a bending displacement characteristic of the actuator element 12 as shown in FIG. 10B. The bending displacement characteristic of the piezoelectric/electrostrictive element, which is obtained by applying the electric field between the pair of electrodes 22a, 22b, is asymmetrical in relation to a reference electric field point (point of the electric field=0) as a center.

Figure 2:
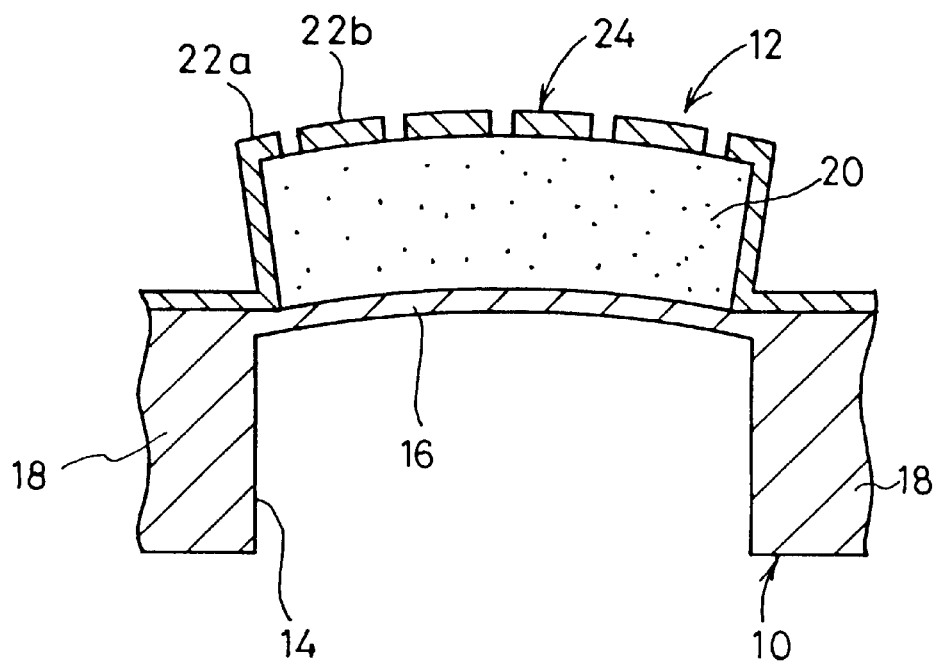
FIG. 2 shows a cross-sectional view illustrating a state in which an actuator element of the piezoelectric/electrostrictive element according to the embodiment of the present invention is displaced in a first direction.

The bending displacement characteristic is obtained by applying a predetermined voltage between the pair of electrodes 22a, 22b of the main actuator element 24 to perform a polarization treatment for the piezoelectric/electrostrictive layer 20, and then observing the bending displacement of the actuator element 12 while continuously changing the voltage applied to the actuator element 12. As shown in FIG. 2, the bending displacement is herein referred to such that the direction of bending displacement is positive when the actuator element 12 makes bending displacement in a convex manner in a first direction (direction for the pair of electrodes 22a, 22b formed on the piezoelectric/electrostrictive layer 20 to face the free space), while the direction of bending displacement is negative when the actuator element 12 makes bending displacement in a concave manner.

Figure 11A:
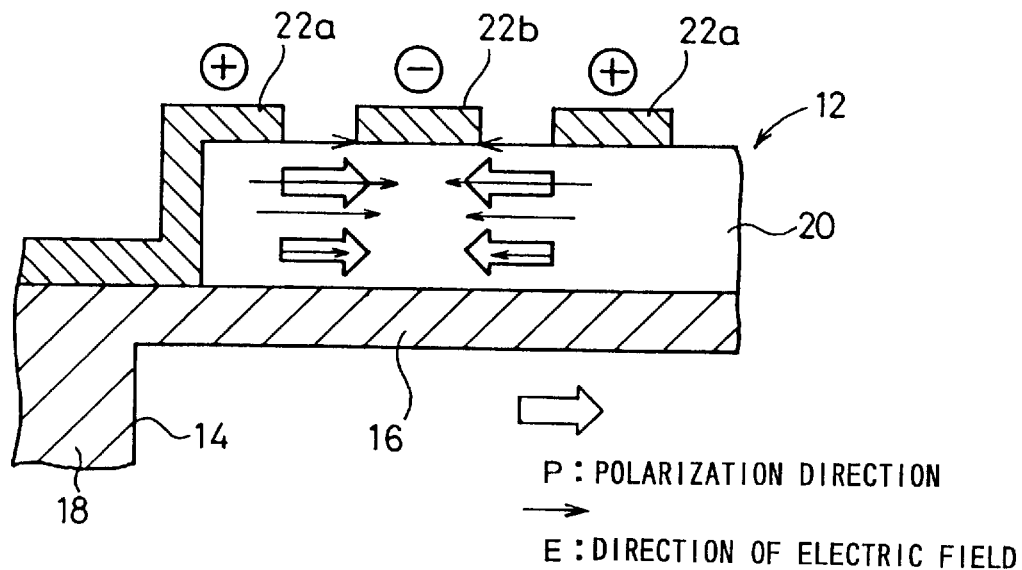
FIG. 11A explanatorily shows a polarization direction and a direction of an electric field obtained when the piezoelectric/electrostrictive layer is subjected to an initial polarization treatment.

The measurement of the bending displacement characteristic will be specifically explained with reference to an example. At first, as shown in FIG. 11A, when a predetermined voltage is applied in the positive direction between the pair of electrodes 22a, 22b to perform the polarization treatment for the piezoelectric/electrostrictive layer 20, for example, an electric field in the positive direction (for example, an electric field indicated by +5E in FIG. 10B) is generated in the superficial direction around the first principal surface of the piezoelectric/electrostrictive layer 20. In this procedure, an expression of 1E=about 2.5 kV/mm is given.

The intensity of the electric field generated in the piezoelectric/electrostrictive layer 20 is largest at the first principal surface, and it is gradually decreased in the depth direction. Accordingly, polarization does not proceed easily at deep portions. However, polarization can be allowed to proceed up to such portions located in the depth direction by applying a sufficient electric field, taking a sufficient time, and applying an appropriate amount of heat.

An electric field (+5E), which exceeds the range of use of the electric field usable to normally operate the actuator (for example, a range of +3E to −3E in FIG. 10B), is applied, for example, for 7 hours at an appropriate temperature. Thus the polarization treatment is achieved in the same direction as that of the applied electric field.

Figure 11B:
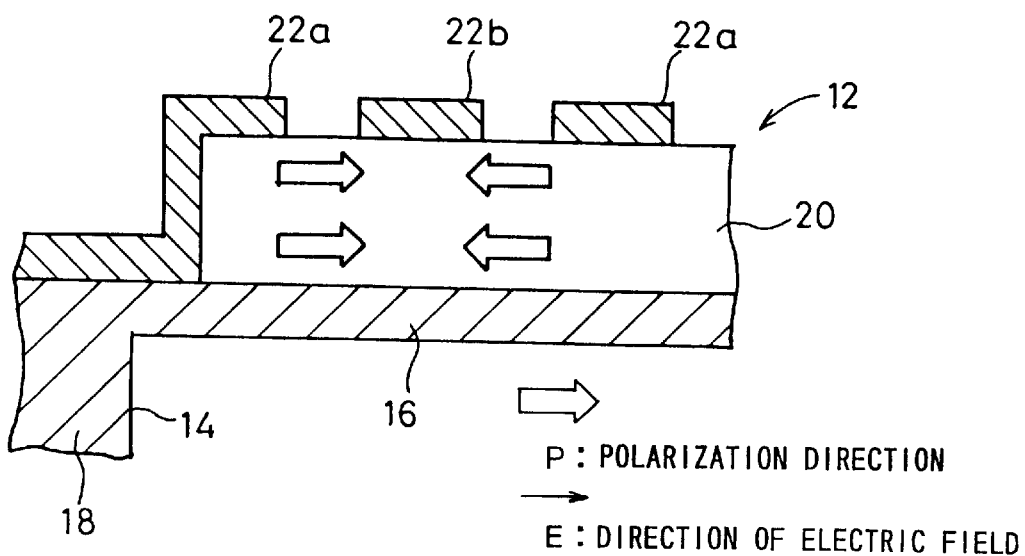
FIG. 11B explanatorily shows a polarization direction in a state (no-voltage-loaded state) in which voltage application to the pair of electrodes is stopped.

After that, as shown in FIG. 11B, the voltage application between the pair of electrodes is stopped to give a no-voltage-loaded state. Simultaneously with the start of measurement, a sine wave having a frequency of 1 Hz and peak values of ±3E (see FIG. 10A) is applied to the piezoelectric/electrostrictive element. During this process, the displacement amount is continuously measured at respective points (Point A to Point D) by using a laser displacement meter. FIG. 10B shows a characteristic curve obtained by plotting results of the measurement on a graph of electric field-bending displacement. As indicated by arrows in FIG. 10B, the displacement amount of the bending displacement continuously changes in accordance with continuous increase and decrease in electric field while providing a certain degree of hysteresis.

Figure 12A:
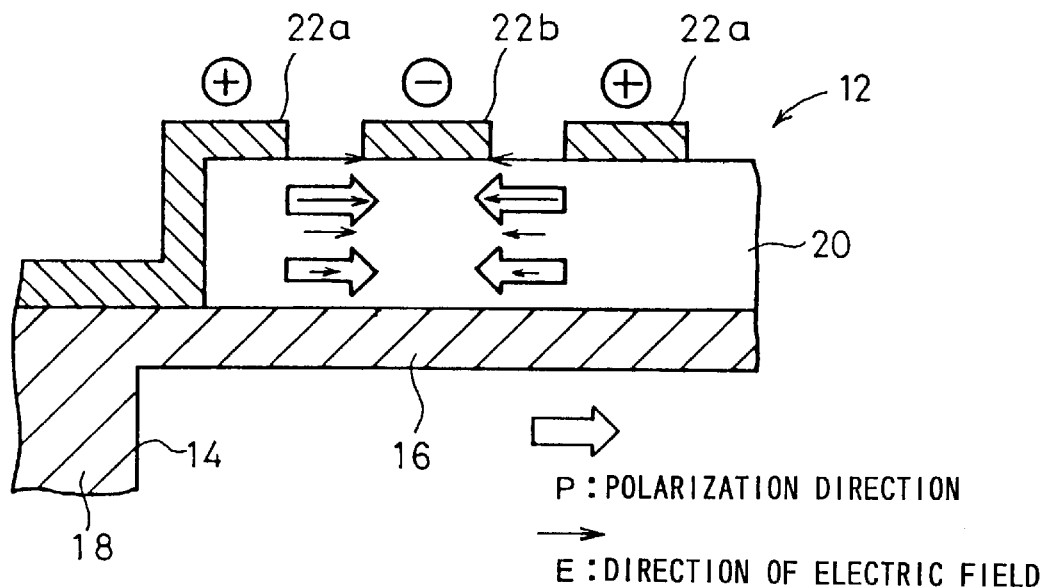
FIG. 12A explanatorily shows a polarization direction and a direction of an electric field obtained in a state in which the electric field (+3E) is applied in the positive direction to the piezoelectric/electrostrictive element according to the embodiment of the present invention.

Specifically, it is assumed that the measurement is started from a point of an electric field +3E indicated by Point A. At first, at Point A, as shown in FIG. 12A, the polarization direction is coincident with the direction of the electric field in the piezoelectric/electrostrictive layer 20, and the electric field is applied intensely in the vicinity of the surface of the piezoelectric/electrostrictive layer 20. Accordingly, the piezoelectric/electrostrictive layer 20 is elongated in the horizontal direction, and the actuator element 12 makes bending displacement in an amount of about 0.8 Δy in the first direction (direction for the pair of electrodes 22a, 22b formed on the piezoelectric/electrostrictive layer 20 to face the free space) (see FIG. 10B). In this process, an expression of 1 Δy=about 1.6 μm is given.

After that, the following operation is performed in a stage in which the voltage applied between the pair of electrodes 22a, 22b is changed, and an electric field is generated in the piezoelectric/electrostrictive element in a direction opposite to the direction of the electric field upon the polarization treatment.

Figure 12B:
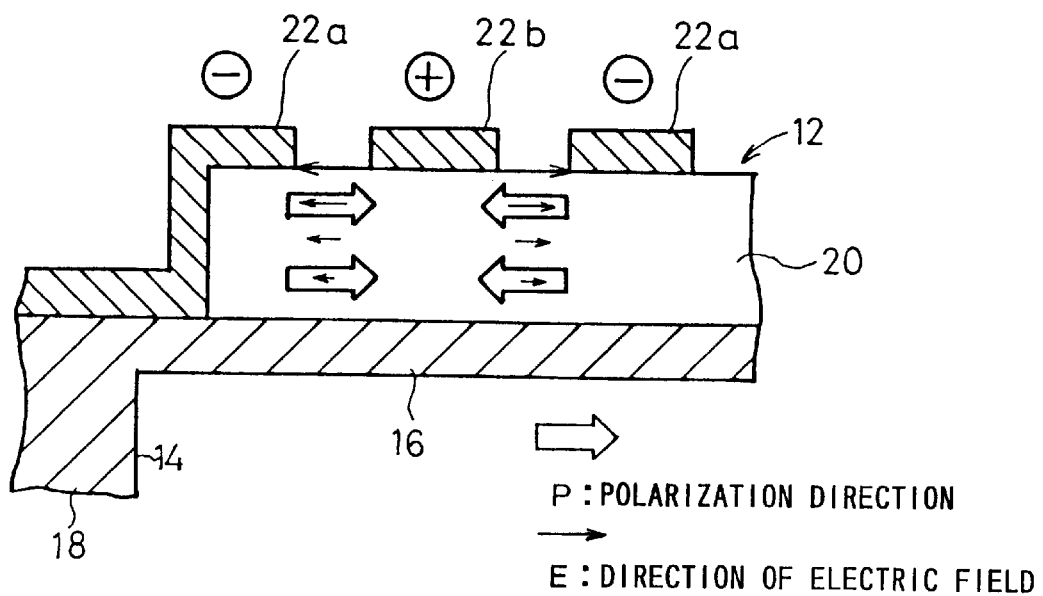
FIG. 12B explanatorily shows a polarization direction and a direction of an electric field obtained in a state in which the predetermined electric field (−0.6E) in the negative direction is applied to the piezoelectric/electrostrictive element.

At first, for example, at a stage of Point B at which the electric field is weak (−0.6E), the polarization direction is opposite to the direction of the electric field in the piezoelectric/electrostrictive layer 20 as shown in FIG. 12B, and the piezoelectric/electrostrictive layer 20 is contracted in the horizontal direction. Accordingly, the actuator element 12 makes bending displacement in an amount of about −0.3 Δy in a second direction (direction directed from the piezoelectric/electrostrictive layer 20 to the vibrating section 16). In this stage, the polarization at the surface portion of the piezoelectric/electrostrictive layer 20 begins to make inversion. Therefore, the electric field (−0.6E) at Point B can be defined to be the predetermined electric field.

Figure 13A:
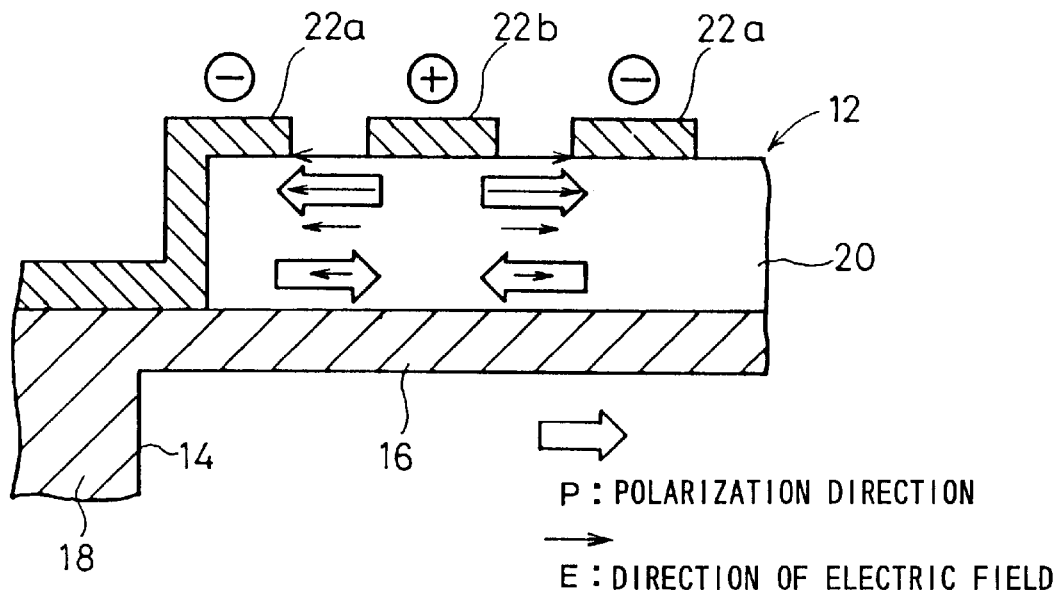
FIG. 13A explanatorily shows a polarization direction and a direction of an electric field obtained in a state in which the electric field (−3E) is applied in the negative direction to the piezoelectric/electrostrictive element according to the embodiment of the present invention.

After that, when the electric field is intensified in the negative direction, the inversion of polarization proceeds at the surface portion of the piezoelectric/electrostrictive layer 20 as shown in FIG. 13A. As a result, a phenomenon occurs in which the polarization direction is coincident with the direction of the electric field in the vicinity of the surface of the piezoelectric/electrostrictive layer 20, while the polarization direction is opposite to the direction of the electric field at the deep portions of the piezoelectric/electrostrictive layer 20. Namely, in the piezoelectric/electrostrictive layer 20, there are two different polarization directions which direct opposite with each other. Accordingly, the piezoelectric/electrostrictive element functions as a pseudo-bi-morph type actuator element.

Especially at a stage in which the electric field is −3E, the displacement amount of the actuator element 12 is extremely large owing to the pseudo-bi-morph type action. In the instance shown in FIG. 10B, there is given a displacement= about 2.6 Δy.

Figure 13B:
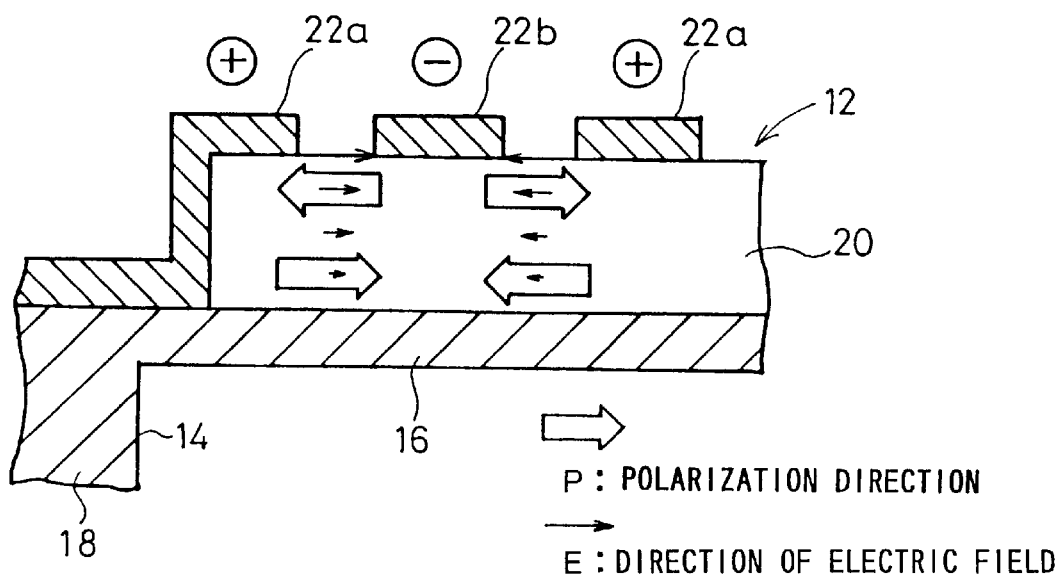
FIG. 13B explanatorily shows a polarization direction and a direction of an electric field obtained in a state in which the predetermined electric field (+0.6E) in the positive direction is applied to the piezoelectric/electrostrictive element.

Next, when the electric field is changed from the negative direction to the positive direction to arrive at a stage in which the electric field is weak, for example, at Point D (+0.6E), the polarization direction is opposite to the direction of the electric field in the vicinity of the surface of the piezoelectric/electrostrictive layer 20, while the polarization direction is coincident with the direction of the electric field at the deep portions of the piezoelectric/electrostrictive layer 20 as shown in FIG. 13B. As a result, a conformation is provided in which the surface portion of the piezoelectric/electrostrictive layer 20 is contracted in the horizontal direction, and the deep portion of the piezoelectric/electrostrictive layer 20 is elongated in the horizontal direction. Accordingly, the actuator element 12 makes bending displacement in an amount of about −1.0 Δy in the second direction (direction directed from the piezoelectric/electrostrictive layer 20 to the vibrating section 16). In this stage, the polarization at the surface portion of the piezoelectric/electrostrictive layer 20 begins to make inversion. Therefore, the electric field (+0.6E) at Point D can be defined to be the predetermined electric field in the same manner as the electric field at Point B.

Subsequently, as the electric field is gradually intensified in the positive direction, the inversion of polarization proceeds in the vicinity of the surface of the piezoelectric/electrostrictive layer 20, and the polarization direction is coincident with the direction of the electric field in the piezoelectric/electrostrictive layer 20. Therefore, the stage directed from Point D to Point A may be called "repolarization treatment stage".

As described above, in order to evaluate whether the bending displacement characteristic is the symmetrical characteristic or the asymmetrical characteristic, it is necessary to perform the measurement by using the electric field which is substantially larger than the predetermined electric field (±0.6E). However, if the measurement is performed by using an electric field which is only slightly larger than the predetermined electric field, a situation may occur in which it is impossible to distinguish the asymmetrical characteristic which is the inherent characteristic of the piezoelectric/electrostrictive element according to the embodiment of the present invention.

Therefore, in order to distinguish the asymmetrical characteristic for the bending displacement characteristic, it is desirable to evaluate the bending displacement characteristic by applying, in an alternating manner, an electric field which is not less than four times the electric field (defined herein as "predetermined electric field) at which the polarization direction begins to make inversion partially. Namely, it is possible to easily evaluate the asymmetrical characteristic for the bending displacement characteristic by using a large absolute amount of displacement to perform the measurement.

For example, in the case of the conventional piezoelectric/electrostrictive element, the coercive field is ±0.5E. Therefore, the measurement may be performed on condition that the electric field in the positive direction is not less than +2.0E, and the electric field in the negative direction is not more than −2.0E. In the case of the piezoelectric/electrostrictive element according to the embodiment of the present invention, the coercive field is ±0.6E. Therefore, the measurement may be performed on condition that the electric field in the positive direction is not less than +2.4E, and the electric field in the negative direction is not more than −2.4E.

In FIG. 10B, the bending displacement characteristic is measured by applying, in an alternating manner, the electric field (±3E) which is sufficiently larger than the predetermined electric field (±0.6E). In this case, the displacement amount ya is 0.8 Δy at the peak value (Point A) of the electric field in the positive direction, and the displacement amount yc is 2.6 Δy at the peak value (Point C) of the electric field in the negative direction. Accordingly, there is given a relationship of yc=3.25ya.

Figure 14:
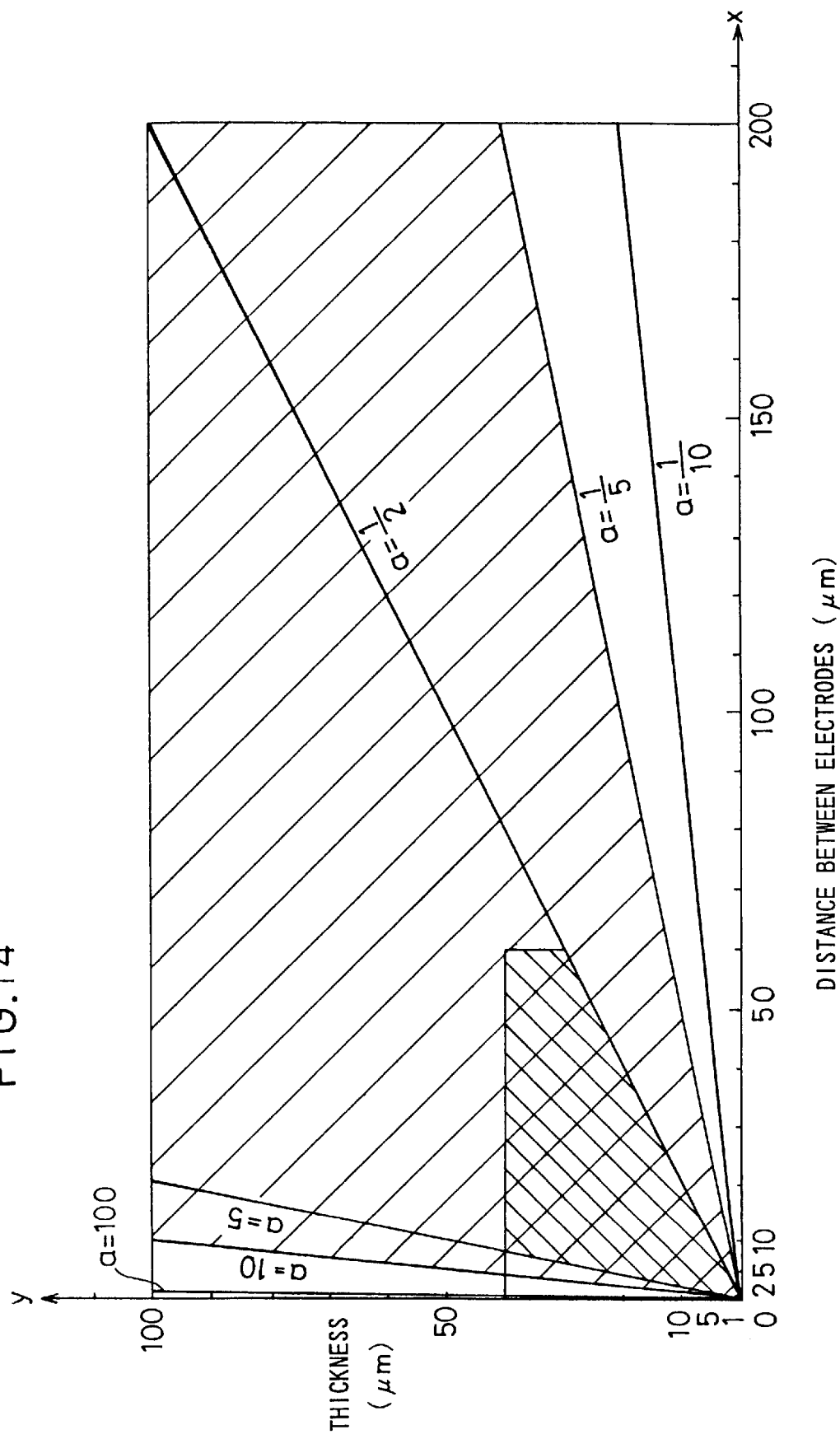
FIG. 14 shows characteristic curves illustrating a dimensional relationship between the thickness of the piezoelectric/electrostrictive layer and the distance between the pair of electrodes of the piezoelectric/electrostrictive element according to the embodiment of the present invention.

Next, explanation will be made for dimensional relationships for allowing the bending displacement characteristic to have the asymmetrical characteristic. At first, the distance x between the pair of electrodes 22a, 22b and the thickness y of the piezoelectric/electrostrictive layer 20 will be described. As shown in FIG. 14, on condition that expressions of 1 $\mu$m$\leq$x$\leq$200 $\mu$m and 1 $\mu$m$\leq$y$\leq$100 $\mu$m are satisfied, and a relationship of y=ax is satisfied, it is specified that a range of $\frac{1}{10}$$\leq$a$\leq$100 is satisfied. Especially, as for the proportional constant a, the range is preferably $\frac{1}{5}$$\leq$a$\leq$10, and more preferably $\frac{1}{2}$$\leq$a$\leq$5. In this case, when expressions of 1 $\mu$m$\leq$x$\leq$60 $\mu$m and 1 $\mu$m$\leq$y$\leq$40 $\mu$m are satisfied, the polarization direction is easily inverted up to an appropriate depth of the piezoelectric/electrostrictive layer 20 upon application of the electric field in the direction opposite to the polarization direction, and the displacement amount is effectively increased. Accordingly, this condition is optimum for the actuator element 12.

Figure 15B:
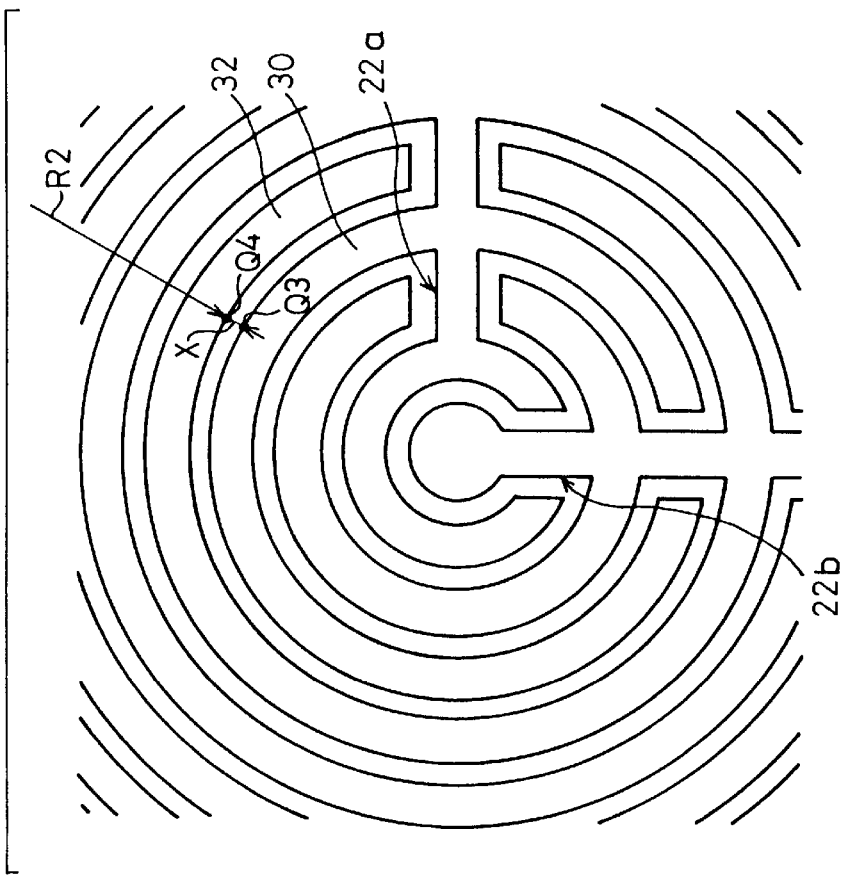
FIG. 15B explanatorily shows the distance between the electrodes in which the pair of electrodes have a branched planar configuration.
Figure 15A:
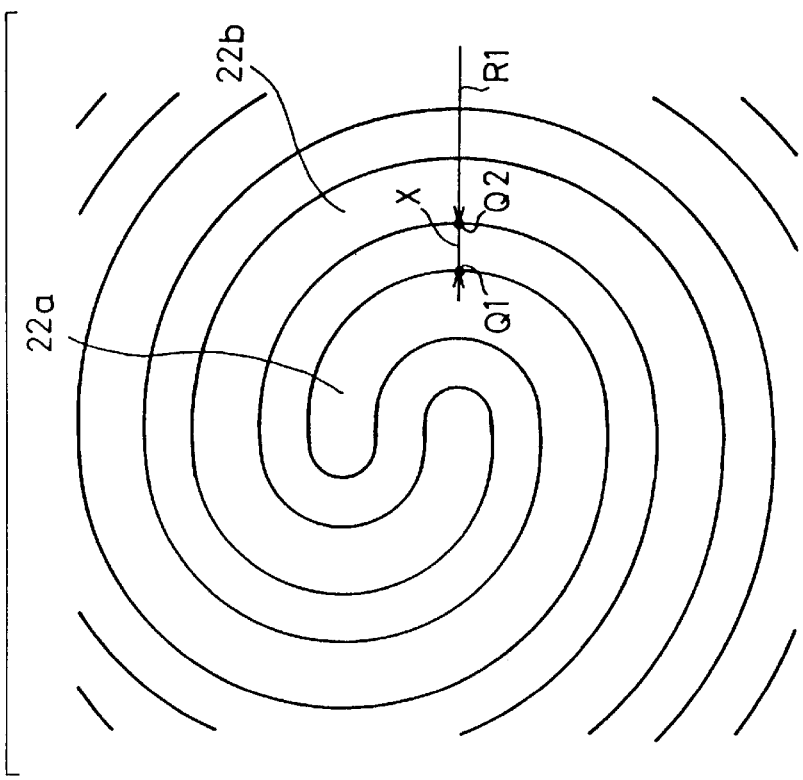
FIG. 15A explanatorily shows the distance between the electrodes in which the pair of electrodes have a spiral planar configuration.

The distance x between the pair of electrodes 22a, 22b is determined as follows when the pair of electrodes 22a, 22b have the spiral planar configuration. Namely, as shown in FIG. 15A, for example, when a normal R1 is drawn from an outer circumferential edge of the first electrode 22a, the distance x is indicated by a distance between a starting point Q1 of the normal R1 and an intersection point Q2 between the normal R1 and an inner circumferential edge of the second electrode 22b.

When the pair of electrodes 22a, 22b have the branched planar configuration, the distance x between the pair of electrodes 22a, 22b is determined as follows. Namely, as shown in FIG. 15B, for example, when a normal R2 is drawn from an outer circumferential edge of a branch 30 of the first electrode 22a, the distance x is indicated by a distance between a starting point Q3 of the normal R2 and an intersection point Q4 between the normal R2 and an inner circumferential edge of a branch 32 of the second electrode 22b.

Next, the thickness y of the piezoelectric/electrostrictive layer 20 and the thickness z of the vibrating section 16 will be described. As shown in FIG. 16, on condition that expressions of 1 $\mu$m$\leq$y$\leq$100 $\mu$m and 1 $\mu$m$\leq$z$\leq$50 $\mu$m are satisfied, and a relationship of y=bz is satisfied, it is specified that a range of $\frac{1}{5}$$\leq$b$\leq$10 is satisfied. Especially, as for the proportional constant b, the range is preferably $\frac{1}{3}$$\leq$b$\leq$5. In this case, when expressions of 1 $\mu$m$\leq$y$\leq$40 $\mu$m and 1 $\mu$m$\leq$z$\leq$20 $\mu$m are satisfied, the displacement amount is effectively increased. Accordingly, this condition is optimum for the actuator element 12. In other words, when the thickness y of the piezoelectric/electrostrictive layer 20 and the thickness z of the vibrating section 16 are specified as described above, it is certain that the displacement amount of the actuator element 12 is effectively increased.

Further, as shown in FIGS. 17A to 18B, it is preferable for the piezoelectric/electrostrictive element according to the embodiment of the present invention that the cross-sectional configuration concerning the minimum dimension m passing through the center of the vibrating section 16 satisfies the following conditions. It is noted that the pair of electrodes 22a, 22b are omitted in FIGS. 17A to 18B, in order to avoid complication of the drawings.

Figure 17A:
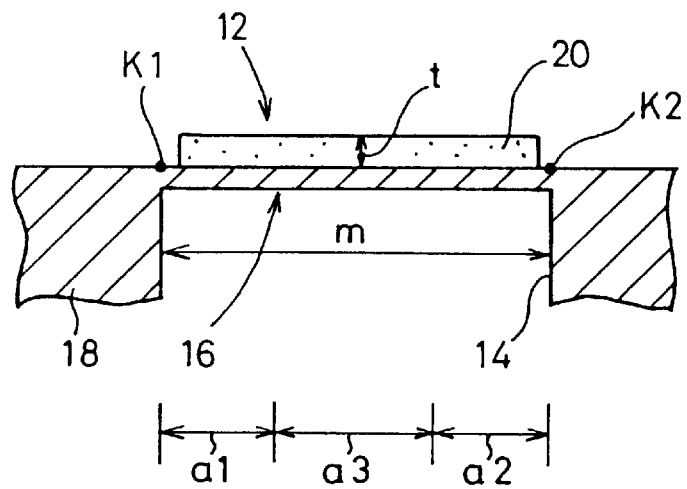
FIG. 17A shows a cross-sectional view illustrating, with partial omission, a cross-sectional shape of the actuator element in the shortest dimension.
Figure 17B:
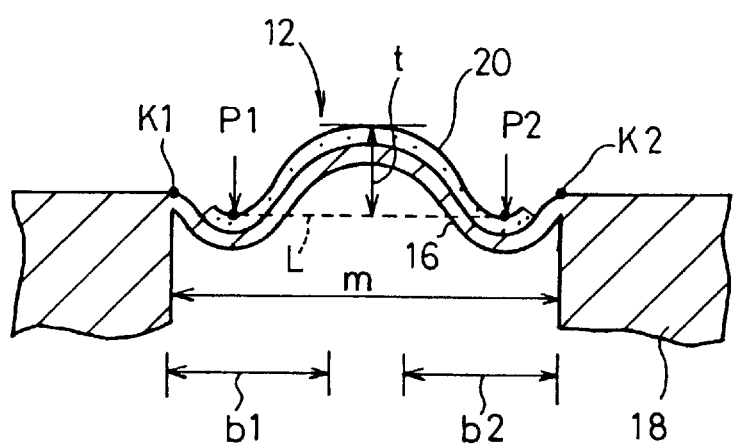
FIG. 17B shows a cross-sectional view illustrating, with partial omission, a case in which one outermost local minimum point and the other outermost local minimum point exist under the upper surface of the fixed section.

Namely, as shown in FIG. 17B, at least a part of the upper surface of the piezoelectric/electrostrictive layer 20 in the vicinity of its center makes, in the no-voltage-loaded state (state of the electric field E=0), a protrusion in a direction directed oppositely to the vibrating section 16 from a reference line L formed by connecting one outermost local minimum point P1 and the other outermost local minimum point P2 adjacent to the fixed section 18.

The vicinity of the center of the piezoelectric/electrostrictive layer 20 is herein defined as follows as shown in FIG. 17A. Concerning the shortest dimension m, boundary portions between the upper surface of the fixed section 18 and the upper surface of the vibrating section 16 are defined as one boundary point K1 and the other boundary point K2. When the shortest dimension m is regarded to be 100, the vicinity of the center of the piezoelectric/electrostrictive layer 20 is indicated by a central range a3 of 40%, except for a range a1 of 30% ranging from the one boundary point K1 toward the center of the shortest dimension m, and a range a2 of 30% ranging from the other boundary point K2 toward the center of the shortest dimension m.

The one outermost local minimum point P1 is defined as follows as shown in FIG. 17B. Concerning the shortest dimension m, a plurality of local minimum points are formed on a projection line concerning the first principal surface of the piezoelectric/electrostrictive layer 20 and the upper surface of the vibrating section 16 with respect to the plane of the shortest dimension. Among the plurality of the local minimum points, the one outermost local minimum point P1 corresponds to a local minimum point which is closest to the one boundary point K1. Among the plurality of the local minimum points, the other outermost local minimum point P2 corresponds to a local minimum point which is closest to the other boundary point K2.

In this case, on condition that the shortest dimension m is regarded to be 100, the one outermost local minimum point P1 is acknowledged to be a local minimum point which exists within a range of 40% (one local minimum point-existing region b1) ranging from the one boundary point K1 toward the center of the shortest dimension m, and which is closest to the one boundary point K1. The other outermost local minimum point P2 is acknowledged to be a local minimum point which exists within a range of 40% (the other local minimum point-existing region b2) ranging from the other boundary point K2 toward the center of the shortest dimension m, and which is closest to the other boundary point K2.

Figure 17C:
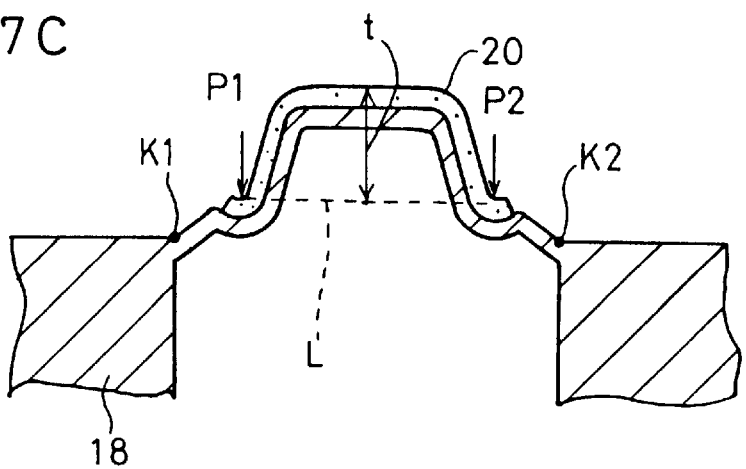
FIG. 17C shows a cross-sectional view illustrating, with partial omission, a case in which one outermost local minimum point and the other outermost local minimum point exist over the upper surface of the fixed section.

As shown in FIG. 17B, the outermost local minimum points P1, P2 may exist under the upper surface of the fixed section 18. As shown in FIG. 17C, the outermost local minimum points P1, P2 may exist over the upper surface of the fixed section 18.

Figure 18A:
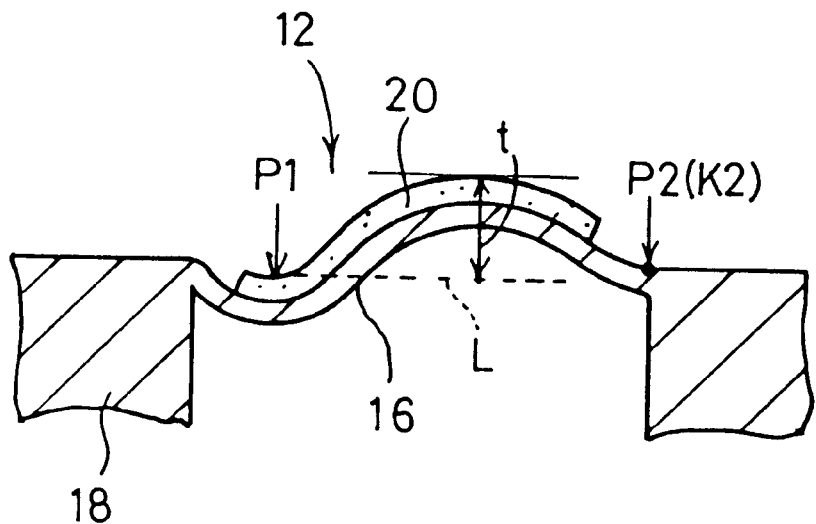
FIG. 18A shows a cross-sectional view illustrating, with partial omission, an illustrative case in which the other outermost local minimum point does not exist in the other local minimum point-existing region, and the other boundary point is regarded as the other outermost local minimum point.
Figure 18B:
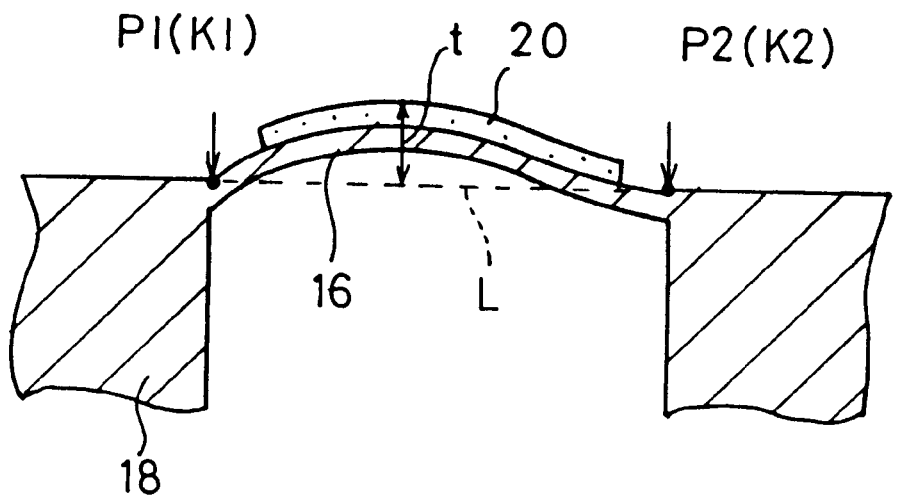
FIG. 18B shows a cross-sectional view illustrating, with partial omission, an illustrative case in which no outermost local minimum point exists in both of the local minimum point-existing regions respectively, and one boundary point and the other boundary point are regarded as one outermost local minimum point and the other outermost local minimum point respectively.

As shown in FIG. 18A, for example, when the other outermost local minimum point P2 does not exist in the other local minimum point-existing region b2, the other boundary point K2 is acknowledged to be the other outermost local minimum point P2. Such acknowledgment is made in the same manner for the one outermost local minimum point P1. As shown in FIG. 18B, when the respective outermost local minimum points P1, P2 do not exist in both of the local minimum point-existing regions b1, b2, the one boundary point K1 and the other boundary point K2 are acknowledged to be the one outermost local minimum point P1 and the other outermost local minimum point P2 respectively.

Under the foregoing condition, i.e., under the condition that "at least a part of the upper surface in the vicinity of the center of the piezoelectric/electrostrictive layer 20 makes, in the no-voltage-loaded state, a protrusion in a direction directed oppositely to the vibrating section 16 from a reference line L'', it is more preferable that the amount of protrusion t satisfies $m/1000 \leq t \leq m/10$ provided that the length of the shortest dimension is m.

By satisfying the foregoing condition, the produced actuator elements 12 is allowed to necessarily make large displacement in the first direction, making it possible to achieve improvement in yield when it is used for various electronic instruments and the like.

As described above, in the piezoelectric/electrostrictive element according to the embodiment of the present invention, the main actuator element 24 is constructed by the piezoelectric/electrostrictive layer 20 and the pair of electrodes 22a, 22b formed on the first principal surface of the piezoelectric/electrostrictive layer 20. Further, the displacement characteristic of the actuator element 12, which is obtained by applying, between the pair of electrodes 22a, 22b, the electric field which is not less than four times the predetermined electric field, is asymmetrical in relation to the reference electric field point as the center. Accordingly, when the electric field is applied in the opposite direction after the polarization treatment is performed for the piezoelectric/electrostrictive layer 20, the polarization direction is inverted to be the same as the direction of the electric field in the vicinity of the surface of the piezoelectric/electrostrictive layer 20 because the intensity of the electric field is large, while the polarization direction is not inverted at deep portions of the piezoelectric/electrostrictive layer 20 because the intensity of the electric field is small. Namely, two polarization directions, which are different from each other, exist in the piezoelectrostrictive layer 20, and thus the piezoelectric/electrostrictive element functions as the pseudo-bi-morph type piezoelectric/electrostrictive element.

As a result, the direction of strain in the vicinity of the surface of the piezoelectric/electrostrictive layer 20 is mutually opposite to that of the deep portions, and the entire actuator element 12 makes convex displacement in the first direction. The displacement amount is extremely large owing to the pseudo-bi-morph type action.

Especially, in the piezoelectric/electrostrictive element according to the embodiment of the present invention, the bending displacement characteristic is asymmetrical in the positive and negative directions of the electric field in relation to the reference electric field point (point of the electric field=0) as the center. Therefore, for example, the difference occurs in the bending displacement amount between the two peak values of the periodically changing electric field. Accordingly, the relative displacement amount is increased between the no-voltage-loaded state and the voltage-applied state, and the relative displacement amount is increased between the states in which electric fields in mutually opposite directions are applied respectively. Therefore, it is possible to realize easy control when the piezoelectric/electrostrictive element is utilized for actuators and improvement in sensitivity when the piezoelectric/electrostrictive element is utilized for sensors.

In the piezoelectric/electrostrictive element according to the embodiment of the present invention, the relationship of $y=ax$ is satisfied, and the expression of $1/10 \leq a \leq 100$ is satisfied provided that x represents the distance between the pair of electrodes 22a, 22b ($1\ \mu m \leq x \leq 200\ \mu m$), and y represents the thickness of the piezoelectric/electrostrictive layer 20 ($1\ \mu m \leq y \leq 100\ \mu m$).

Accordingly, the displacement characteristic of the actuator element 12, which is obtained by applying the electric field between the pair of electrodes 22a, 22b, can be made asymmetrical in relation to the reference electric field point (point at which the electric field E=0) as the center, as shown in FIG. 10B.

In the piezoelectric/electrostrictive element according to the embodiment of the present invention, the vibrating section 16 and the fixed section 18 are formed in the integrated manner by using ceramic. The recess 14 is formed at the position corresponding to the vibrating section 16 so that the vibrating section 16 is thin-walled. Accordingly, the fixed section 18 and the vibrating section 16 can be easily produced. Therefore, the piezoelectric/electrostrictive element is advantageous in order to reduce the production cost.

The piezoelectric/electrostrictive element is constructed such that the thick-walled fixed section 18 and the thin-walled vibrating section 16 are formed by providing the recess 14 in the substrate 10 composed of ceramics. Thus the vibrating section 16 sensitively respond to the displacement of the piezoelectric/electrostrictive layer 20, and the vibrating section 16 can promptly follow any change in voltage signal. Further, the rigidity is sufficiently ensured at the boundary between the vibrating section 16 and the fixed section 18. Therefore, breakage scarcely occurs due to fatigue of the boundary which would be otherwise caused by vibration of the vibrating section 16.

In the piezoelectric/electrostrictive element according to the embodiment of the present invention, the relationship of y=bz is satisfied, and the expression of $1/5 \leq b \leq 10$ is satisfied provided that y represents the thickness of the piezoelectric/electrostrictive layer 20 (1 $\mu m \leq y \leq 100$ $\mu m$), and z represents the thickness of the vibrating section 16 (1 $\mu \leq z \leq 50$ $\mu m$). Accordingly, as shown in FIG. 10B, the bending displacement characteristic, which is obtained by applying the electric field between the pair of electrodes 22a, 22b, can be made asymmetrical in relation to the reference electric field point as the center.

Figure 19:
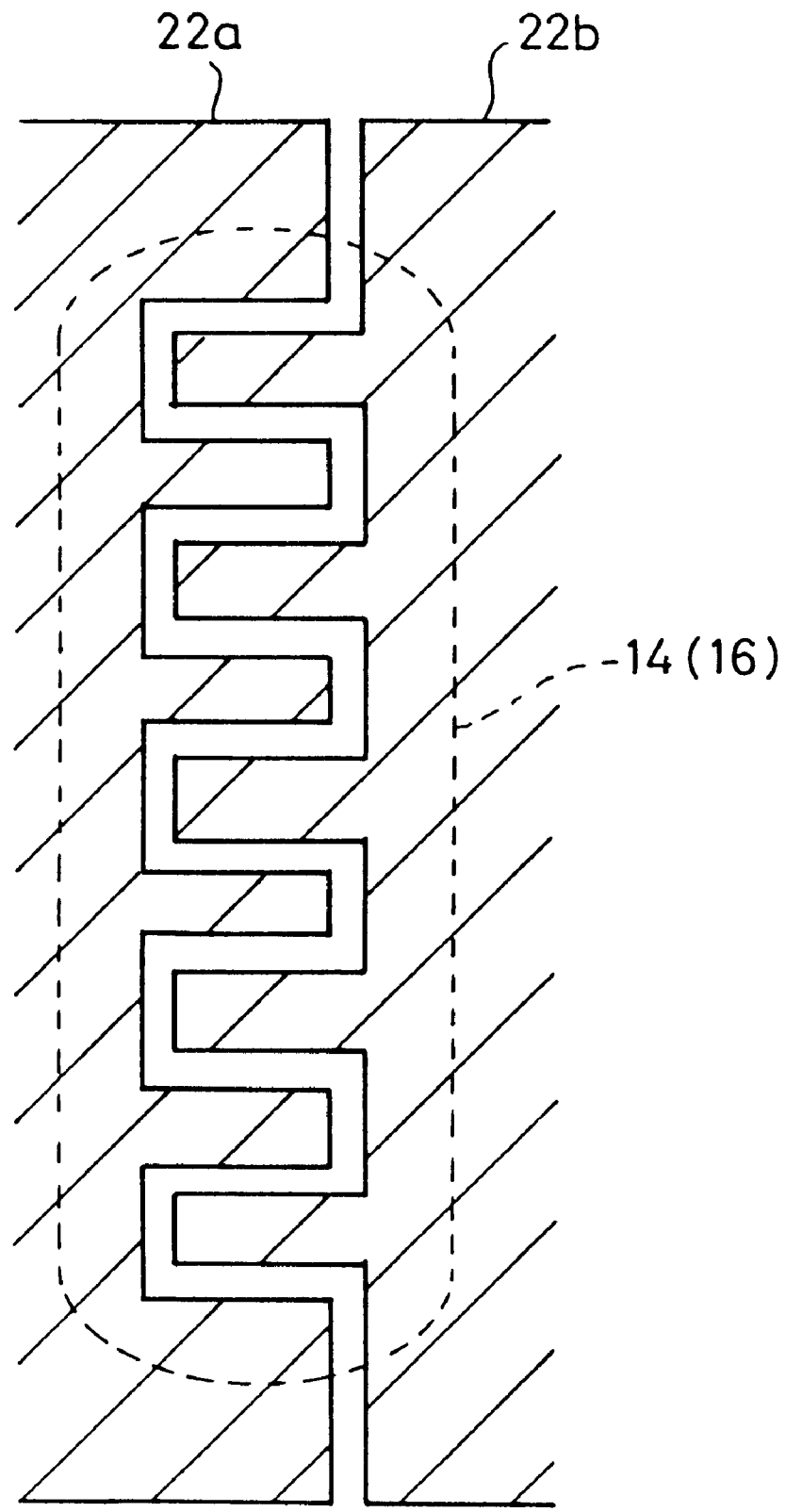
FIG. 19 shows a plan view illustrating a preferred embodiment including a pair of electrodes having a comb-shaped planar configuration.

The piezoelectric/electrostrictive element according to the embodiment of the present invention has been specifically explained, as including the pair of electrodes 22a, 22b having the spiral planar configuration or the branched planar configuration. However, as shown in FIG. 19, the pair of electrodes 22a, 22b may have a comb-shaped configuration. In this embodiment, it is preferable that a pair of comb-shaped electrodes are formed, in which the shape of the vibrating section 16 satisfies a length-to-width ratio (aspect ratio) of not more than 0.25 or not less than 4.0, and the direction of arrangement of a large number of comb teeth is directed along the longitudinal direction of the vibrating section 16. When this condition is satisfied, the same effect as those obtained by using the spiral configuration and the branched planar configuration can be obtained by using the pair of electrodes 22a, 22b having the comb-shaped configuration.

However, in order to increase the relative displacement amount, it is most preferable that the shape of the vibrating section 16 has an aspect ratio of 0.25 to 4.0, and preferably 0.5 to 2.0, and the pair of electrodes 22a, 22b have the spiral or branched planar configuration.

Next, explanation will be made for selection of the respective constitutive components of the actuator element 12, especially selection of materials for the respective constitutive components.

At first, it is preferable that the vibrating section 16 is composed of a highly heat-resistant material, because of the following reason. Namely, when the actuator element 12 has a structure in which the vibrating section 16 is directly supported by the fixed section 18 without using any material such as an organic adhesive which is inferior in heat resistance, the vibrating section 16 is preferably composed of a highly heat-resistant material so that the vibrating section 16 is not deteriorated at least during the formation of the piezoelectric/electrostrictive layer 20.

It is preferable that the vibrating section 16 is composed of an electrically insulative material in order to electrically separate the wiring (vertical selection line 48: see FIG. 21) communicating with the first electrode 22a of the pair of electrodes 22a, 22b formed on the substrate 10, from the wiring (signal line 50: see FIG. 21) communicating with the second electrode 22b.

Therefore, the vibrating section 16 may be composed of a material such as a highly heat-resistant metal and a porcelain enamel produced by coating a surface of such a metal with a ceramic material such as glass. However, the vibrating section 16 is optimally composed of a ceramic.

Those usable as the ceramic for constructing the vibrating section 16 include, for example, stabilized zirconium oxide, aluminum oxide, magnesium oxide, titanium oxide, spinel, mullite, aluminum nitride, silicon nitride, glass, and mixtures thereof. Stabilized zirconium oxide is especially preferred because of, for example, high mechanical strength obtained even when the thickness of the vibrating section 16 is thin, high toughness, and small chemical reactivity with the piezoelectric/electrostrictive layer 20 and the pair of electrodes 22a, 22b. The term "stabilized zirconium oxide" includes stabilized zirconium oxide and partially stabilized zirconium oxide. Stabilized zirconium oxide has a crystal structure such as cubic crystal, and hence it does not cause phase transition.

On the other hand, zirconium oxide causes phase transition between monoclinic crystal and tetragonal crystal at about 1000° C. Cracks appear during the phase transition in some cases. Stabilized zirconium oxide contains 1 to 30 mole % of a stabilizer such as calcium oxide, magnesium oxide, yttrium oxide, scandium oxide, ytterbium oxide, cerium oxide, and oxides of rare earth metals. In order to enhance the mechanical strength of the vibrating section 16, the stabilizer preferably comprises yttrium oxide. In this composition, yttrium oxide is contained preferably in an amount of 1.5 to 6 mole %, and more preferably 2 to 4 mole %. It is preferable that aluminum oxide is further contained in an amount of 0.1 to 5 mole %. Further, it is also preferable that titanium oxide is contained in an amount of 0.1 to 10 mole %, or aluminum oxide+titanium oxide are contained in an amount of 0.1 to 10 mole %, in order to increase the relative displacement amount and ensure tight contact with the piezoelectric/electrostrictive material.

The crystal phase may be, for example, a mixed phase of cubic crystal+monoclinic crystal, a mixed phase of tetragonal crystal+monoclinic crystal, and a mixed phase of cubic crystal+tetragonal crystal+monoclinic crystal. However, among them, most preferred are those having a principal crystal phase composed of tetragonal crystal or a mixed phase of tetragonal crystal+cubic crystal, from viewpoints of strength, toughness, and durability.

When the vibrating section 16 is composed of a ceramic, a large number of crystal grains construct the vibrating section 16. In order to increase the mechanical strength of the vibrating section 16, the crystal grains preferably have an average grain diameter of 0.05 to 2 $\mu m$, and more preferably 0.1 to 1 $\mu m$.

The fixed section 18 preferably composed of a ceramic. The fixed section 18 may be composed of the same ceramic material as that used for the vibrating section 16, or the fixed section 18 may be composed of a ceramic material different from that used for the vibrating section 16. Those usable as the ceramic material for constructing the fixed section 18 include, for example, stabilized zirconium oxide, aluminum oxide, magnesium oxide, titanium oxide, spinel, mullite, aluminum nitride, silicon nitride, glass, and mixtures thereof, in the same manner as the ceramic material for the vibrating section 16.

Especially, those preferably adopted for the substrate 10 used in the piezoelectric/electrostrictive element according to the embodiment of the present invention include, for example, materials containing a major component of zirconium oxide, materials containing a major component of aluminum oxide, and materials containing a major component of a mixture thereof. Among them, those containing a major component of zirconium oxide are more preferable. Clay or the like is added as a sintering aid in some cases. However, it is necessary to control sintering aid components in order not to contain an excessive amount of those liable to form glass such as silicon oxide and boron oxide because of the following reason. Namely, although the materials which are liable to form glass are advantageous to join the substrate 10 to the piezoelectric/electrostrictive layer 20, the materials facilitate the reaction between the substrate 10 and the piezoelectric/electrostrictive layer 20, making it difficult to maintain a predetermined composition of the piezoelectric/electrostrictive layer 20. As a result, the materials make a cause to deteriorate the element characteristics.

Namely, it is preferable that silicon oxide or the like in the substrate 10 is restricted to have a weight ratio of not more than 3%, and more preferably not more than 1%. The term "major component" herein refers to a component which exists in a proportion of not less than 50% in weight ratio.

Preferably, piezoelectric ceramics may be used as a constitutive material for the piezoelectric/electrostrictive layer 20. However, for the piezoelectric/electrostrictive layer 20, it is allowable to use electrostrictive ceramics or ferroelectric ceramics. The material for the piezoelectric/electrostrictive layer 20 is not limited to ceramics, which may be a piezoelectric material composed of a high-molecular compound represented by PVDF (polyfluorovinylidene), or a composite comprising such a high-molecular compound and a ceramic.

Those preferably used to produce the film-shaped piezoelectric/electrostrictive layer 20 of the main actuator element 24 include, for example, a material containing a major component of lead zirconate titanate (PZT system), a material containing a major component of lead magnesium niobate (PMN system), a material containing a major component of lead nickel niobate (PNN system), a material containing a major component of lead manganese niobate, a material containing a major component of lead antimony stannate, a material containing a major component of lead zinc niobate, a material containing a major component of lead titanate, a material containing a major component of lead magnesium tantalate, a material containing a major component of lead nickel tantalate, and a composite material thereof.

Further, those preferably used also include materials containing, in the foregoing piezoelectric/electrostrictive material, an additive of oxide or another type of compound of, for example, lanthanum, barium, niobium, zinc, cerium, cadmium, chromium, cobalt, antimony, iron, yttrium, tantalum, tungsten, nickel, manganese, lithium, strontium, and bismuth, such as those obtained by appropriately adding a predetermined additive to the foregoing material to give those of the PLZT system.

Among the piezoelectric/electrostrictive materials as described above, those advantageously used include a material containing a major component comprising lead magnesium niobate, lead zirconate, and lead titanate, a material containing a major component comprising lead nickel niobate, lead magnesium niobate, lead zirconate, and lead titanate, a material containing a major component comprising lead magnesium niobate, lead nickel tantalate, lead zirconate, and lead titanate, and a material containing a major component comprising lead magnesium tantalate, lead magnesium niobate, lead zirconate, and lead titanate. These are recommended as a material to be used when the piezoelectric/electrostrictive element 20 is formed in accordance with the thick film formation method such as screen printing.

When the piezoelectric/electrostrictive material of the multicomponent system is used, the piezoelectric/electrostrictive characteristics change depending on the composition of components. However, it is preferable to use a composition in the vicinity of the morphotropic phase boundary of pseudo-cubic crystal-tetragonal crystal-rhombohedral crystal, in the case of the material of the three component system of lead magnesium niobate-lead zirconate-lead titanate and the materials of the four component system of lead magnesium niobate-lead nickel tantalate-lead zirconate-lead titanate and lead magnesium tantalate-lead magnesium niobate-lead zirconate-lead titanate which are preferably adopted for the piezoelectric/electrostrictive element according to the embodiment of the present invention. Especially, it is advantageous to adopt a composition comprising lead magnesium niobate: 15 mole % to 50 mole %, lead zirconate: 10 mole % to 45 mole %, and lead titanate: 30 mole % to 45 mole %, a composition comprising lead magnesium niobate: 15 to 50 mole %, lead nickel tantalate: 10 to 40%, lead zirconate: 10 to 45 mole %, and lead titanate: 30 to 45 mole %, and a composition comprising lead magnesium niobate: 15 to 50 mole %, lead magnesium tantalate: 10 to 40%, lead zirconate: 10 to 45 mole %, and lead titanate: 30 to 45 mole %, because of their high piezoelectric constant and their high electromechanical coupling factor.

The piezoelectric/electrostrictive layer 20 may be either dense or porous. When the piezoelectric/electrostrictive layer 20 is porous, its porosity is preferably not more than 40%.

It is preferable that the thickness of the vibrating section 16 of the substrate 10 have a dimension identical to that of the thickness of the piezoelectric/electrostrictive layer 20 formed on the vibrating section 16, because of the following reason. Namely, if the thickness of the vibrating section 16 is extremely thicker than the thickness of the piezoelectric/electrostrictive layer 20 (if the former is different from the latter by not less than one figure), when the piezoelectric/electrostrictive layer 20 makes contraction upon sintering, the vibrating section 16 behaves to inhibit the shrinkage. For this reason, the stress at the boundary surface between the piezoelectric/electrostrictive layer 20 and the substrate 10 is increased, and consequently they are easily peeled off from each other. On the contrary, when the dimension of the thickness is in an identical degree between the both, it is easy for the substrate 10 (vibrating section 16) to follow the shrinkage of the piezoelectric/electrostrictive layer 20 upon sintering. Accordingly, such dimension of the thickness is preferred to achieve integration. Specifically, the vibrating section 16 preferably has a thickness of 1 to 50 $\mu$m, more preferably 3 to 50 $\mu$m, and much more preferably 3 to 20 $\mu$m. On the other hand, the piezoelectric/electrostrictive layer 20 preferably has a thickness of 1 to 100 µm, more preferably 3 to 50 µm, and much more preferably 5 to 40 µm.

The pair of electrodes 22a, 22b formed on the piezoelectric/electrostrictive layer 20 are allowed to have an appropriate thickness depending on the use or application. However, the thickness is preferably 0.01 to 50 µm, and more preferably 0.1 to 5 µm. The pair of electrodes 22a, 22b are preferably composed of a conductive metal which is solid at room temperature. The metal includes, for example, metal simple substances or alloys containing, for example, aluminum, titanium, chromium, iron, cobalt, nickel, copper, zinc, niobium, molybdenum, ruthenium, rhodium, silver, stanum, tantalum, tungsten, iridium, platinum, gold, and lead. It is needless to say that these elements may be contained in an arbitrary combination.

Next, explanation will be made for the method for producing the piezoelectric/electrostrictive element according to the embodiment of the present invention. The substrate 10, which includes the vibrating section 16 and the fixed section 18, can be made into an integrated unit such that formed layers, which are prepared as green sheets or green tapes, are stacked by applying certain pressure and heat, followed by sintering. For example, the substrate 10 shown in FIG. 1 is preferably obtained by stacking two layers of green sheets or green tapes, in which a through hole having a predetermined shape to form the recess 14 is previously provided in the second layer of the two layers before stacking the first and second layers. Alternatively, a molded layer may be produced by means of, for example, pressing, casting, or injection molding based on the use of a mold so that the recess 14 and other components may be formed therein by means of mechanical processing such as cutting, grinding processing, laser processing, and punching by press processing. The two-layered structure is shown in FIG. 1. However, three-layered or four-layered structure may be used so that the rigidity of the substrate 10 may be improved, or a layer to be used as a back wiring board may be simultaneously stacked.

Next, the main actuator element 24 is formed on the vibrating section 16 of the substrate 10. In this procedure, two methods are available including a film-forming method described later on and a method in which the piezoelectric/electrostrictive layer 20 is formed in accordance with a press molding method based on the use of a mold or a tape-forming method based on the use of a slurry material, the piezoelectric/electrostrictive layer 20 before sintering is stacked on the vibrating section 16 of the substrate 10 before sintering, by applying certain pressure and heat, and they are simultaneously sintered to form the piezoelectric/electrostrictive layer 20 on the vibrating section 16 of the substrate 10.

In the film-forming method, the piezoelectric/electrostrictive layer 20 and the pair of electrodes 22a, 22b are stacked on the vibrating section 16 in this order. Those appropriately usable as the film-forming method include, for example, thick film methods such as screen printing, coating methods such as dipping, and thin film methods such as ion beam, sputtering, vacuum evaporation, ion plating, chemical vapor deposition (CVD), and plating. The wiring arrangements (vertical selection line 48 and signal line 50: see FIG. 21) and terminal pads, which are connected to the pair of electrodes 22a, 22b, are also formed by using the thick film method and the thin film method described above.

For example, the following illustrative production method is adopted for the piezoelectric/electrostrictive element according to the embodiment of the present invention. At first, the piezoelectric/electrostrictive layer 20 is formed on the vibrating section 16 of the substrate 10 by means of the screen printing method. After that, sintering is performed to join the piezoelectric/electrostrictive layer 20 onto the vibrating section 16 of the substrate 10. In this procedure, in order to improve the joining performance between the substrate 10 and the piezoelectric/electrostrictive layer 20 and advantageously integrate the substrate 10 and the piezoelectric/electrostrictive layer 20, it is preferable to carry out sintering for the piezoelectric/electrostrictive layer 20 in an atmosphere of the piezoelectric/electrostrictive material in a tightly sealed vessel. More preferably, it is desirable to increase the atmosphere concentration.

The atmosphere sintering is performed, for example, in accordance with the following method.

(1) Powder composed of the same components as those of the piezoelectric/electrostrictive material, which is used as an evaporation source, is placed together in the tightly sealed vessel.

(2) The composition of the piezoelectric/electrostrictive material is allowed to previously contain an excessive amount of lead components.

(3) A plate made of the piezoelectric/electrostrictive material is used as a setter.

The sintering temperature is preferably 900 to 1400° C., and more preferably 1100 to 1400° C.

Figure 21:
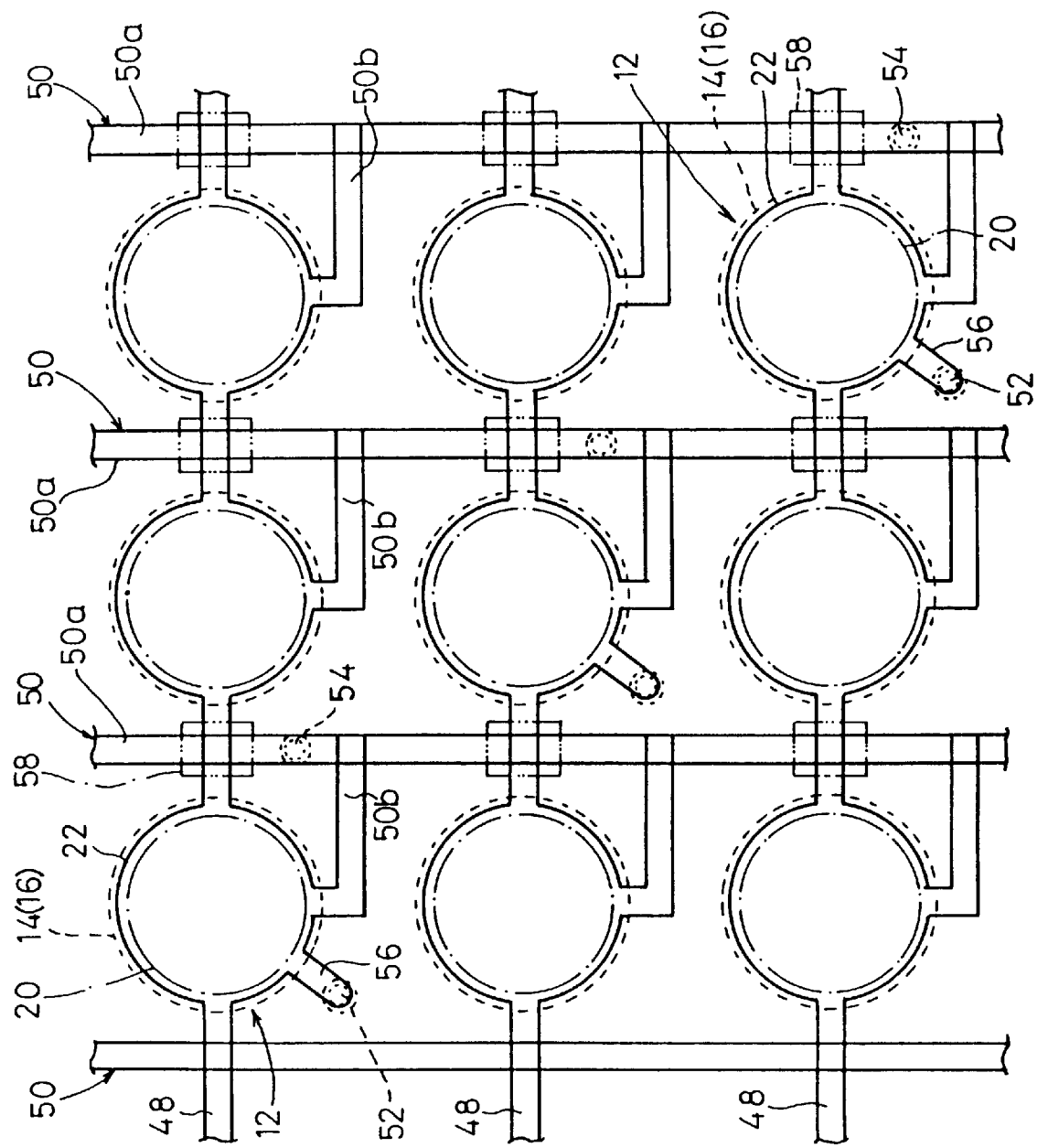
FIG. 21 shows an enlarged plan view illustrating an arrangement of actuator elements (picture elements) in the display device according to the embodiment of the present invention.

After completion of the joining of the substrate 10 to the piezoelectric/electrostrictive layer 20, a wiring layer including the pair of electrodes 22a, 22b is formed by means of the screen printing. The pattern of the wiring layer includes, for example, a pattern for the vertical selection lines 48, a pattern for the signal lines 50, and an electrode pattern, as shown in FIG. 21. At this stage (stage of the screen printing), the electrode pattern has a simple circular configuration which is not the spiral configuration as shown in FIG. 4 or the branched configuration as shown in FIG. 5.

After that, necessary portions of the circular electrode pattern is evaporated off by using, for example, an excimer laser. Thus patterning is performed to provide the spiral configuration as shown in FIG. 4 or the branched configuration as shown in FIG. 5 so that the pair of electrodes 22a, 22b are produced.

A heat treatment is performed after completion of the patterning by means of the excimer laser to complete the formation of the main actuator element 24 on the substrate 10. When the pair of electrodes 22a, 22b are formed in accordance with the thin film method, the heat treatment is not necessarily required.

SPECIFIED EMBODIMENTS

Next, explanation will be made for a display device according to a specified embodiment in which the piezoelectric/electrostrictive element according to the embodiment of the present invention is applied to the display device. Components or parts corresponding to those shown in FIG. 1 are designated by the same reference numerals, duplicate explanation of which will be omitted.

Figure 20:
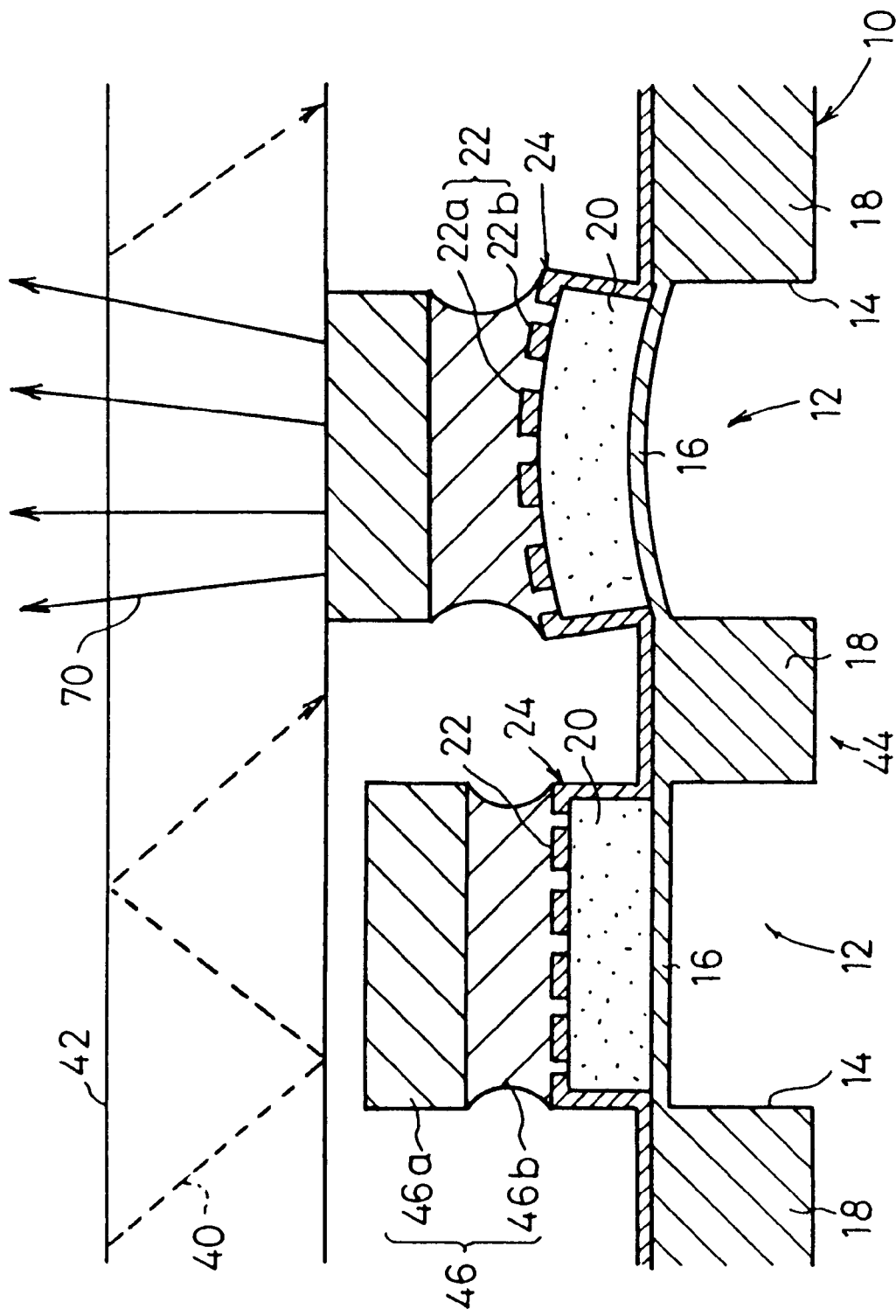
FIG. 20 schematically shows an embodiment in which the piezoelectric/electrostrictive element according to the embodiment of the present invention is applied to a display device (hereinafter simply referred to as "display device according to the embodiment of the present invention).

As shown in FIG. 20, the display device according to the specified embodiment comprises an optical waveguide plate 42 for introducing light 40 thereinto, and a driving unit 44 provided opposingly to the back surface of the optical waveguide plate 42 and including a large number of actuator elements 12 arranged corresponding to picture elements.

The optical waveguide plate 42 has its flat and smooth front and back surfaces, having an optical refractive index so that the light introduced into the inside is subjected to total reflection without being transmitted to the outside of the optical waveguide plate 42 through the front and back surfaces. It is necessary for the optical waveguide plate 42 to use those having a uniform and high transmittance in the wavelength region of visible light. The material for the optical waveguide plate 42 is not especially limited provided that it satisfies the foregoing characteristic. However, specifically, those generally used for the optical waveguide plate 42 include, for example, glass, quartz, light-transmissive plastics such as acrylic plastics, light-transmissive ceramics, structural materials comprising a plurality of layers composed of materials having different refractive indexes, and those having a surface coating layer.

The driving unit 44 has a substrate 10 composed of, for example, a ceramic, and the actuator elements 12 are arranged at positions on the substrate 10 corresponding to the respective picture elements. The substrate 10 is disposed so that its first principal surface is opposed to the back surface of the optical waveguide plate 42. The first principal surface is a continuous surface (flushed surface). A second principal surface thereof has recesses 14 at positions corresponding to the respective picture elements.

A displacement-transmitting section 46 is connected onto each of the actuator elements 12, for increasing the contact area with respect to the optical waveguide plate 42 to provide an area corresponding to the picture element. The displacement-transmitting section 46 comprises a plate member 46a for specifying a substantial light emission area, and a displacement-transmitting member 46b for transmitting the displacement of the actuator element 12 to the plate member 46a.

The displacement-transmitting member 46b preferably has a hardness in a degree to directly transmit the displacement of the actuator element 12 to the optical waveguide plate 42. Therefore, those preferably used as materials for the displacement-transmitting member 46b include, for example, rubber, organic resins, organic resin films, organic adhesive films, and glass. However, it is allowable to use the electrode layer itself, or materials such as the piezoelectric materials and the ceramics described above. Those most preferably used include, for example, organic resins and organic adhesive films based on epoxy compounds, polyphenylene sulfide compounds, polyester compounds, polyimide compounds, acrylic compounds, silicone compounds, and polyolefin compounds. Further, it is also effective to mix a filler with the foregoing compounds to suppress contraction upon curing and expansion.

Those desirably used as materials for the plate member 46a include the materials for the displacement-transmitting member 46b described above, as well as materials obtained by finely dispersing ceramic powder having a high refractive index, such as zirconia powder, titania powder, lead oxide powder, and mixed powder thereof, in an organic resin based on an epoxy, acrylic, or silicone compound, from viewpoints of light emission efficiency and maintenance of flatness. The ceramic powder desirably has an average particle diameter of not more than 1 μm, and more desirably not more than 0.5 μm. In this case, it is preferable to select a ratio of resin weight ceramic powder weight=1:(0.1 to 10). Further, it is preferable to add, to the foregoing composition, glass powder having an average particle diameter of 0.5 to 10 μm in a volume ratio of 1:(0.1 to 1.0) (=ceramic powder: glass powder) with respect to the ceramic powder, because release property and contact property with respect to the surface of the optical waveguide plate 42 are improved.

Preferably, the flatness or the smoothness (Ra) of the portion (surface) of the plate member 46a of the displacement-transmitting section 46 to contact with the optical waveguide plate 42 is sufficiently small as compared with the displacement amount of the actuator element 12, which is specifically not more than 1 μm, more preferably not more than 0.5 μm, and especially preferably not more than 0.1 μm. However, the flatness of the portion (surface) of the displacement-transmitting section 46 to contact with the optical waveguide plate 42 is important in order to reduce the clearance generated when the displacement-transmitting section 46 contacts with the optical waveguide plate 42. Accordingly, there is no limitation to the foregoing flatness range, provided that the contact portion makes deformation in a state of contact.

When the material described above is used for the displacement-transmitting section 46, the displacement-transmitting section 46 may be connected to the main actuator element 24 by stacking the displacement-transmitting section 46 by using an adhesive, or by forming the displacement-transmitting section 46 on the upper portion of the main actuator element 24, in accordance with, for example, a method for coating a solution, a paste, or a slurry composed of the material described above. The displacement-transmitting member 46b and the plate member 46a may be formed integrally by using an identical material. Namely, the displacement-transmitting section 46 may be allowed to simultaneously have the functions of the displacement-transmitting member 46a and the plate member 46a.

As shown in FIG. 21, the wiring arrangement communicating with the respective electrodes 22a, 22b includes vertical selection lines 48 having a number corresponding to a number of rows of a large number of the picture elements, and signal lines 50 having a number corresponding to a number of columns of the large number of the picture elements. Each of the vertical selection lines 48 is electrically connected to the first electrode 22a of each of the picture elements (actuator elements) 12. Each of the signal lines 50 is electrically connected to the second electrode 22b of each of the picture elements 12.

The respective vertical selection lines 48, which are included in one row, are wired in series such that the wiring is led from the first electrode 22a provided for the picture element 12 in the previous column, and then the wiring is connected to the first electrode 22a provided for the picture element 12 in the present column. The signal line 50 comprises a main line 50a extending in the direction of the column, and branch lines 50b branched from the main line 50a and connected to the second electrode 22b of each of the picture elements 12. The voltage signal is supplied to the respective vertical selection lines 48 from an unillustrated wiring board (stuck to the second principal surface of the substrate 10) via through holes 52. The voltage signal is also supplied to the respective signal lines 50 from the unillustrated wiring board via through holes 54.

Various arrangement patterns may be assumed for the through holes 52, 54. However, in the illustrative arrangement shown in FIG. 21, the through holes 52 for the vertical selection lines 48 are formed as follows provided that the number of rows is M, and the number of columns is N. In the case of N=M or N>M, the through hole 52 is formed in the vicinity of a picture element in the nth row and nth column (n=1, 2 . . . ) and at a position deviated toward the signal line (main line) in the (n−1)th column. In the case of N<M, the through hole 52 is formed in the vicinity of a picture element in the (αN+n)th row and nth column (α=0, 1 . . . (quotient of M/N−1)) and at a position deviated toward the signal line (main line) in the (n−1)th column.

On the other hand, the through holes 54 for the signal lines 50 are formed as follows. In the case of N=M or N<M, the through hole 54 is formed on the main line 50a of each of the signal lines 50 and at a position adjacent to a picture element 12 in the nth row and nth column (n=1, 2 . . . In the case of N>M, the through hole 54 is formed on the main line 50a of each of the signal lines 50 and at a position adjacent to a picture element 12 in the nth row and (βM+n)th column (β=0, 1 . . . (quotient of N/M−1)). The through hole 52 for the vertical selection line 48 is not formed on the vertical selection line 48, unlike the through hole 54 for the signal line 50. Accordingly, a relay conductor 56 is formed between the through hole 52 and the first electrode 22a, for making electric connection therebetween.

Insulative films 58 (shown by two-dot chain lines), each of which is composed of, for example, a silicon oxide film, a glass film, or a resin film, are allowed to intervene at portions of intersection between the respective vertical selection lines 48 and the respective signal lines 50, in order to ensure insulation between the mutual wiring arrangements 48, 50.

Figure 22:
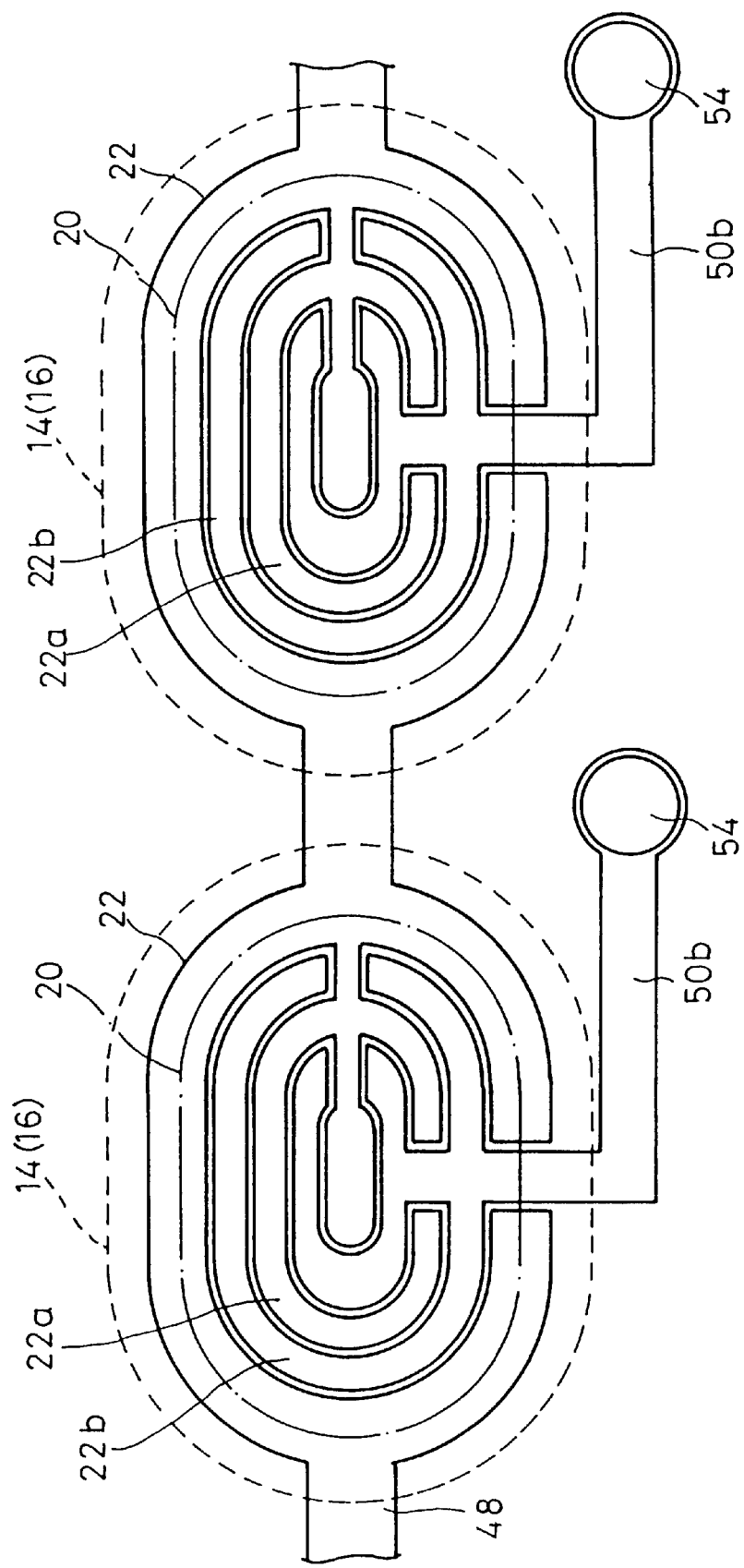
FIG. 22 shows a plan view illustrating the display device according to the embodiment of the present invention, especially illustrating planar configurations (oblong and spiral configurations) of a vibrating section, a piezoelectric/electrostrictive layer, and a pair of electrodes.
Figure 23:
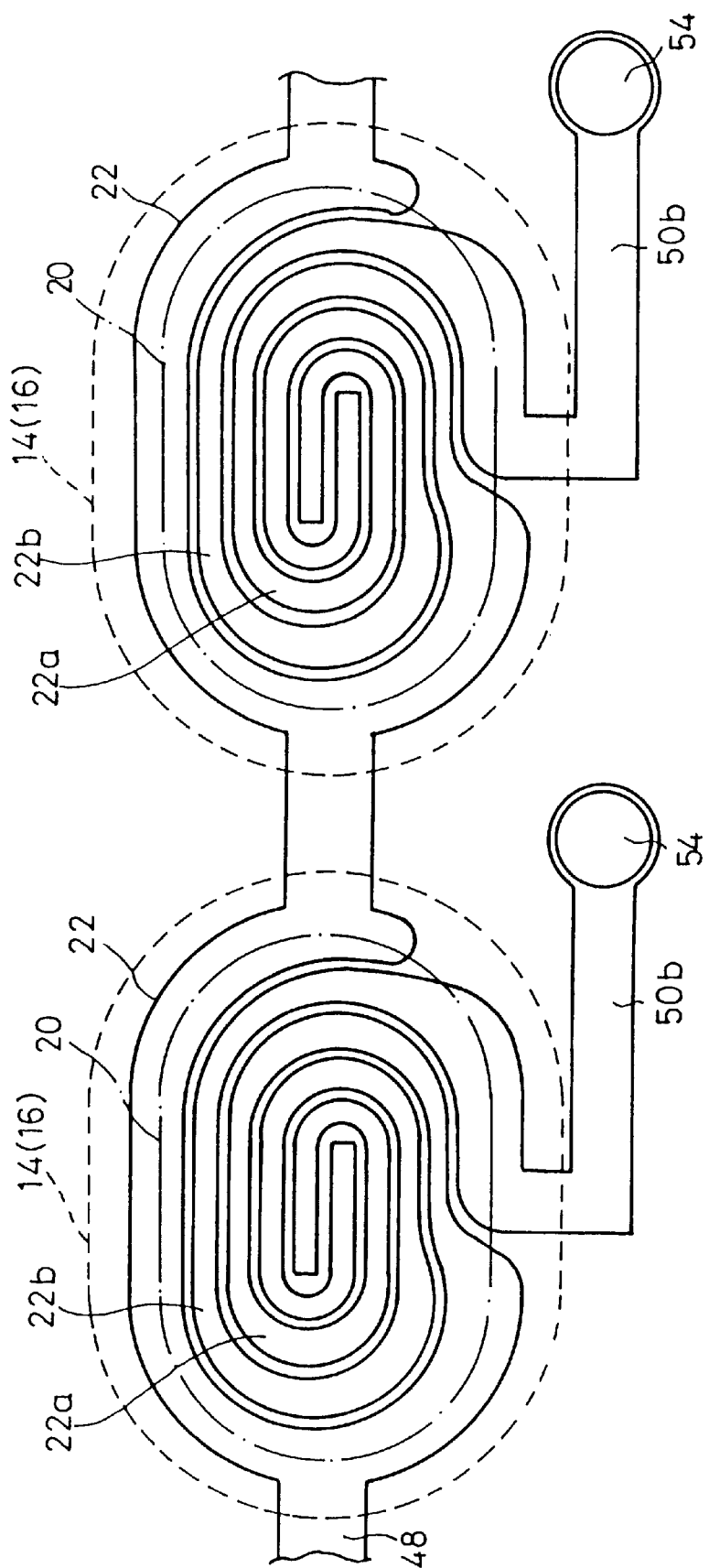
FIG. 23 shows a plan view illustrating the display device according to the embodiment of the present invention, especially illustrating planar configurations (oblong and branched configurations) of a vibrating section, a piezoelectric/electrostrictive layer, and a pair of electrodes.
Figure 24:
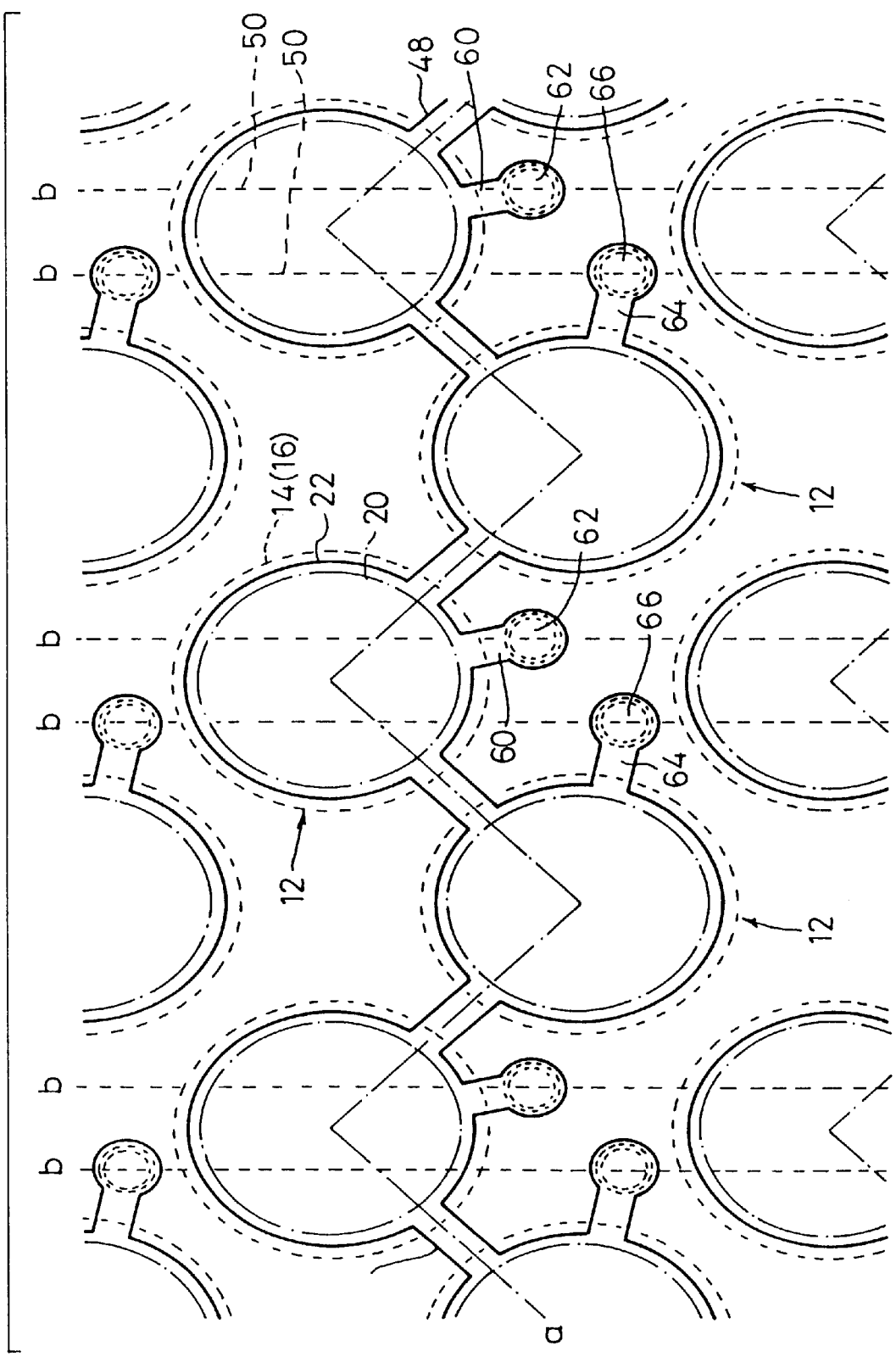
FIG. 24 shows an enlarged plan view illustrating another arrangement of actuator elements (picture elements) in the display device according to the embodiment of the present invention.
Figure 25:
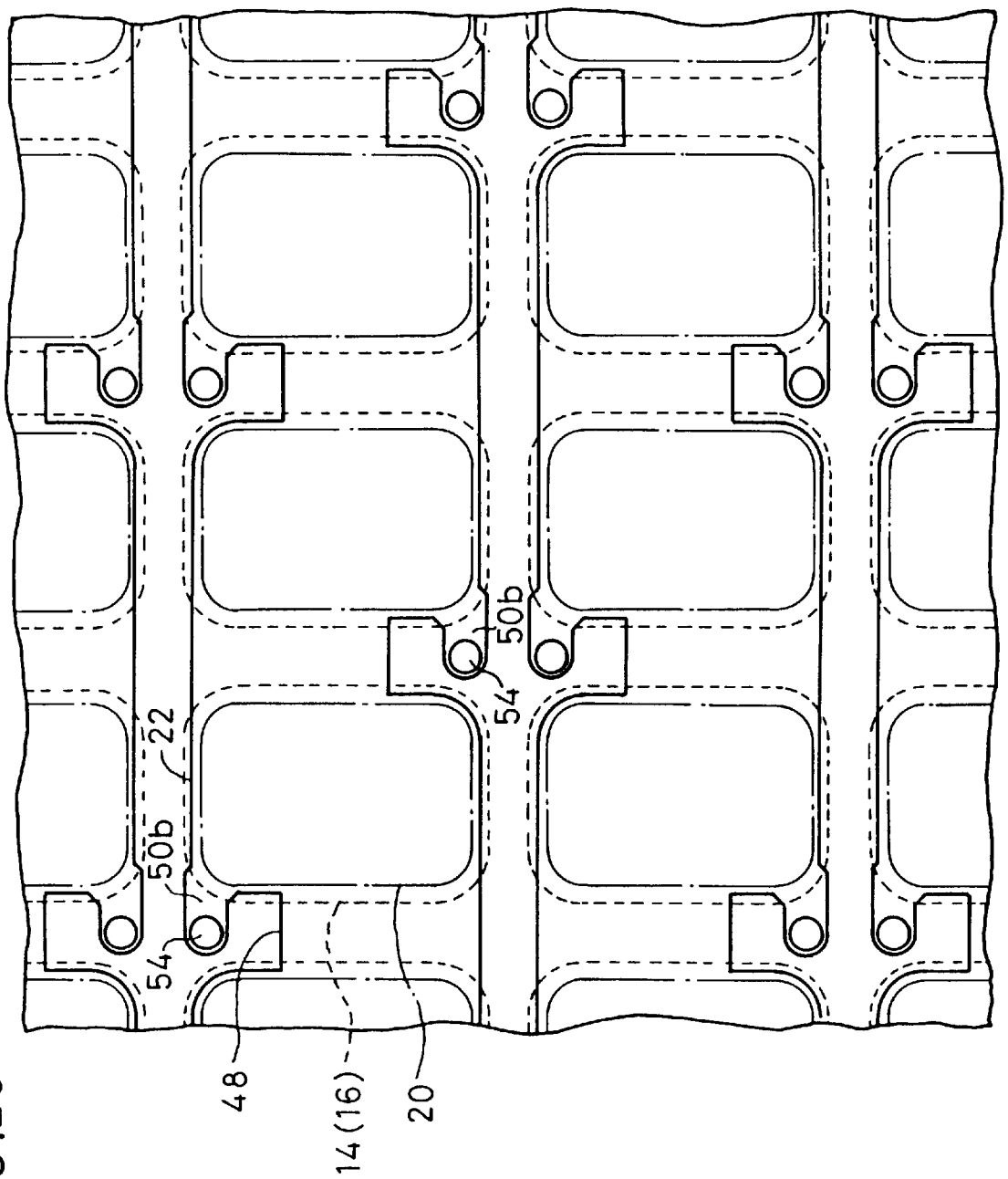
FIG. 25 shows a plan view illustrating the display device according to the embodiment of the present invention, especially illustrating a vibrating section and a piezoelectric/electrostrictive layer (rectangular configuration).
Figure 26:
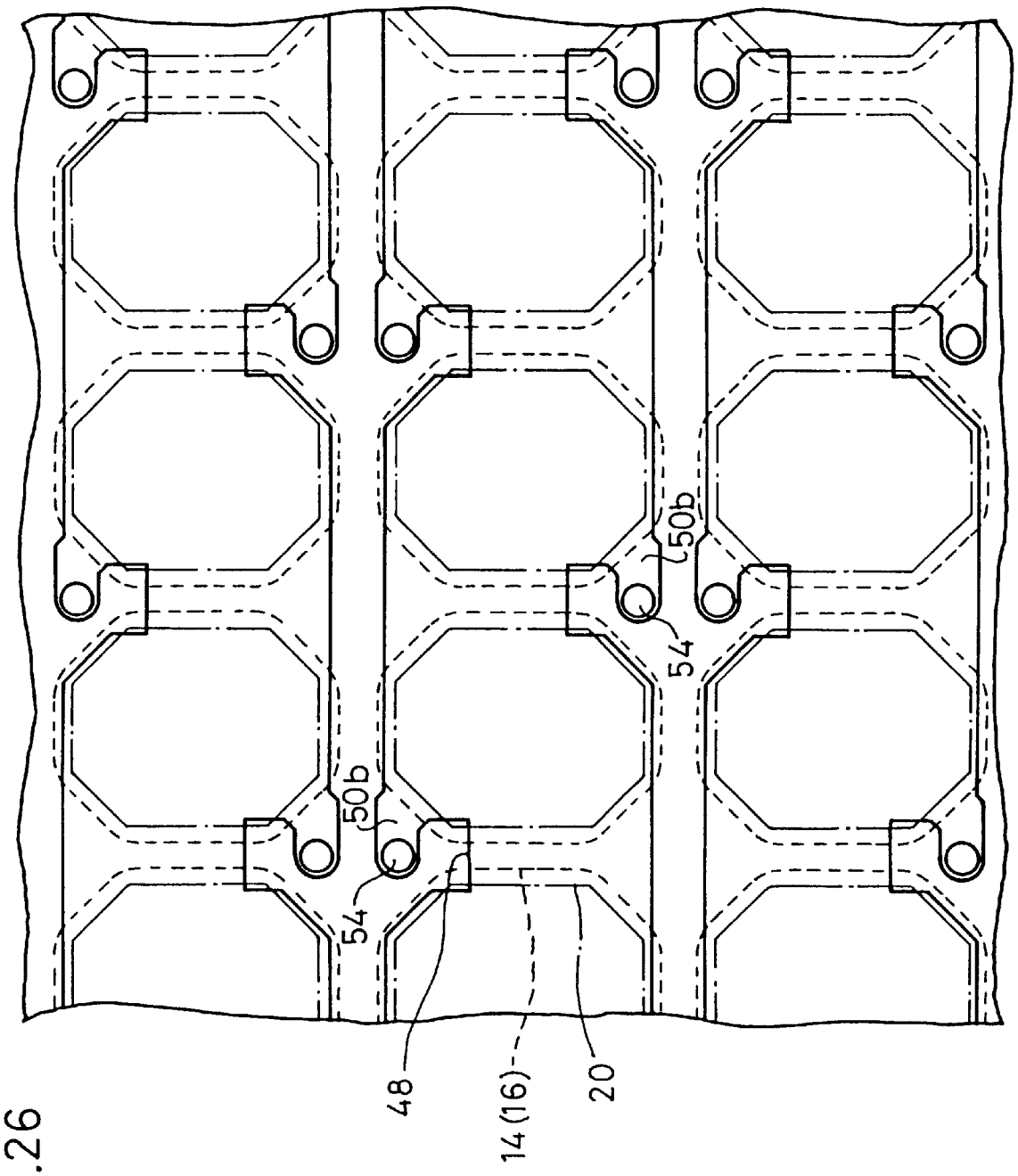
FIG. 26 shows a plan view illustrating the display device according to the embodiment of the present invention, especially illustrating a vibrating section and a piezoelectric/electrostrictive layer (octagonal configuration).

The planar configuration of the pair of electrodes 22a, 22b includes the spiral configuration (see FIG. 4) and the branched configuration (see FIG. 5). The planar configuration of the vibrating section 16, the planar configuration of the piezoelectric/electrostrictive layer 20, and the outer circumferential configuration formed by the pair of electrodes 22a, 22b include a circular configuration as shown in FIG. 21 as well as oblong configurations as shown in FIGS. 22 and 23 and an elliptic configuration as shown in FIG. 24. Alternatively, as shown in FIG. 25, both of the planar configuration of the vibrating section 16 and the planar configuration of the piezoelectric/electrostrictive layer 20 may be preferably rectangular configurations with smoothed corners. Further alternatively, as shown in FIG. 26, both of the planar configuration of the vibrating section 16 and the planar configuration of the piezoelectric/electrostrictive layer 20 may be preferably polygonal configurations (for example, octagonal configurations) with respective apex angle portions having rounded shapes.

The configuration of the vibrating section 16, the planar configuration of the piezoelectric/electrostrictive layer 20, and the outer circumferential configuration formed by the pair of electrodes 22a, 22b may be combinations of circular and elliptic configurations, or combinations of rectangular and elliptic configurations, without any special limitation.

In the illustrative arrangements shown in FIG. 21, the respective actuator elements 12 (picture elements) are arranged in the matrix form on the substrate 10. Alternatively, as shown in FIG. 24, the picture elements (actuator elements) 12 may be arranged in a zigzag form with respect to the respective rows. In the case of the arrangement pattern shown in FIG. 24, the actuator elements (picture elements) 12 are arranged in the zigzag form in relation to the respective rows. Accordingly, the line (indicated by a chain line a) connecting through the vertical selection lines 48 has a zigzag form in relation to each of the rows. The signal lines 50 have a wiring pattern as shown by broken lines b wired on the unillustrated wiring board, in which the picture elements 12 arranged in the zigzag form are divided, for example, into a group of picture elements (actuator elements) 12 located vertically upwardly and a group of picture elements (actuator elements) 12 located vertically downwardly, and two signal lines 50 are wired mutually adjacently at positions corresponding to the former and latter groups of picture elements.

In FIG. 24, the picture elements arranged in the zigzag form are wired as follows. Namely, for example, the second electrode 22b of the picture element (actuator element) 12 located vertically upwardly is electrically connected to the right signal line 50 of the mutually adjacent two signal lines 50, 50, via a relay conductor 60 and a through hole 62. The second electrode 22b of the picture element (actuator element) 12 located vertically downwardly is electrically connected to the left signal line 50 of the mutually adjacent two signal lines 50, 50, via a relay conductor 64 and a through hole 66.

Next, the operation of the display device according to the embodiment of the present invention will be explained. At first, the operation will be explained for each of the actuator elements 12, and then the operation of the display device itself will be explained.

At first, apart from the driving operation of the display device according to the embodiment of the present invention shown in FIG. 20, the respective picture elements (actuator elements) 12 are subjected to the polarization treatment (initial polarization treatment). The initial polarization treatment is performed as follows. Namely, an electric field (+5E), which exceeds the range of use of the electric field usable to normally operate the actuator (for example, a range of +3E to −3E in FIG. 10B), is applied, for example, for 7 hours at an appropriate temperature. Thus the polarization treatment is achieved for the piezoelectric/electrostrictive layer 20 of each of the picture elements in the same direction as that of the applied electric field.

At a stage in which the initial polarization treatment is completed for all of the picture elements, the voltage application between the pair of electrodes 22a, 22b is stopped to give a no-voltage-loaded state.

The display device is operated such that the three basic operations (ON selection, OFF selection, and NO selection) are effected on the picture elements 12 to display a picture.

Figure 27A:
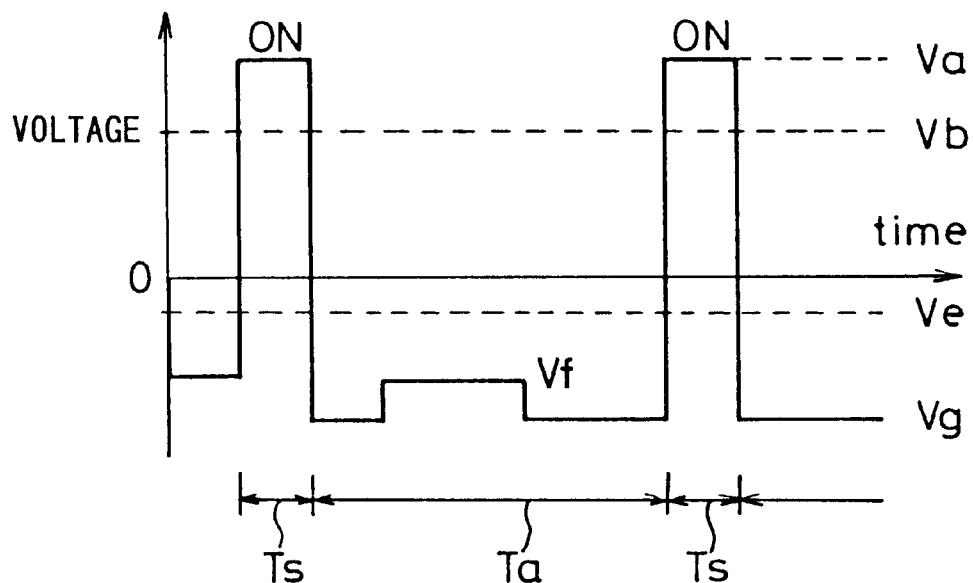
FIG. 27A shows a timing chart illustrating the change in voltage level between the NO selection state and the ON selection state concerning the actuator element.
Figure 27B:
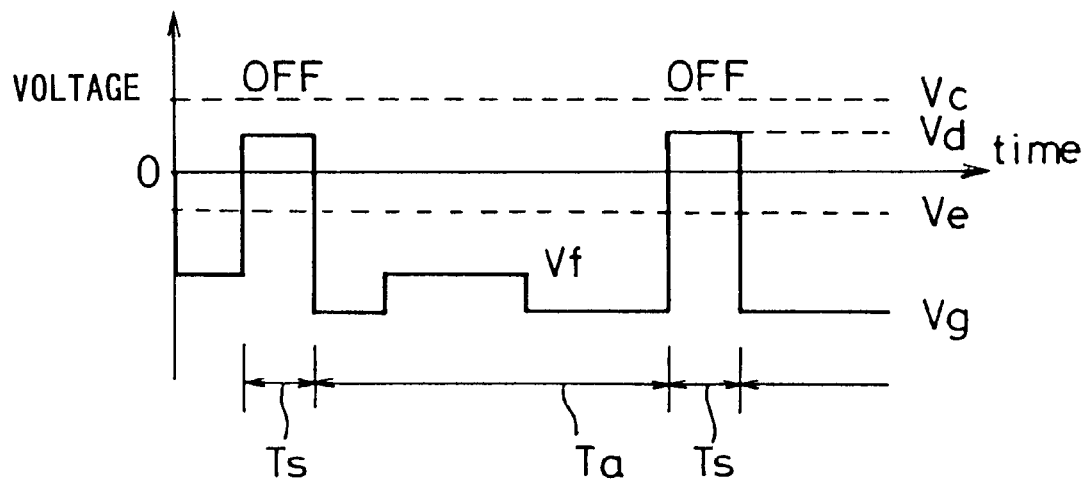
FIG. 27B shows a timing chart illustrating the change in voltage level between the NO selection state and the OFF selection state concerning the actuator element.

As shown in FIG. 27A, ON selection is performed by applying a voltage Va to the pair of electrodes 22a, 22b of the picture element 12 during a predetermined selected term Ts to generate the electric field Ea in the negative direction (see FIG. 10B) between the pair of electrodes 22a, 22b. As shown in FIG. 27B, OFF selection is performed by applying a voltage Vd to the pair of electrodes 22a, 22b of the picture element 12 during a predetermined selected term Ts to generate the electric field Ed in the negative or positive direction (see FIG. 10B) between the pair of electrodes 22a, 22b.

As shown in FIG. 27A or 27B, NO selection is performed by applying a voltage Vf or Vg to the pair of electrodes 22a, 22b of the picture element during a term (non-selected term Ta) other than the selected term Ts to generate the electric field Ef or Eg in the positive direction (see FIG. 10B) between the pair of electrodes 22a, 22b. In the non-selected term Ta, the electric field in the positive direction is generated in the same manner as the initial polarization treatment. Accordingly, the piezoelectric/electrostrictive layer 20 of the picture element, which is in the NO selection state, is subjected to a treatment equivalent to the polarization treatment (the treatment is conveniently referred to as "repolarization treatment").

The driving operation of the display device according to the embodiment of the present invention will be specifically explained. A group of the picture elements included in one row, for example, those included in 1st row, 2nd row, . . . nth row are successively selected for every one horizontal scanning term in accordance with electric potential supply to the vertical selection lines 48 by using, for example, a vertical shift circuit composed of a shift register, on the basis of input of an image signal into the display device. An electric potential is supplied to the signal line 50 corresponding to the picture element 12 which is included in the selected row and which should be subjected to ON selection, during the predetermined selected term Ts, for example, from a horizontal shift circuit composed of a shift register.

As a result, the picture element 12, which is subjected to ON selection by the vertical shift circuit and the horizontal shift circuit, is operated such that a negative predetermined electric potential is applied to its first electrode 22a, and a positive electric potential is applied to its second electrode 22b. Thus the voltage between the pair of electrodes 22a, 22b is the predetermined voltage Va in the negative direction (see FIG. 27A).

At this time, as shown in FIGS. 10B and 13A, for example, the electric field Ea in the negative direction (for example, −3E: electric field in the direction opposite to those of the electric fields upon the initial polarization treatment and NO selection) is generated between the pair of electrodes 22a, 22b, and the actuator element 12 corresponding to the picture element is displaced in the first direction in an amount of about 2.6 Δy. As viewed for the display device, this state exhibits the ON selection state. In the ON selection state, the displacement-transmitting section 46 is displaced toward the optical waveguide plate 42 while the actuator element 12 makes convex deformation, and the displacement-transmitting section 46 contacts with the optical waveguide plate 42.

The displacement-transmitting section 46 contacts with the back surface of the optical waveguide plate 42 in response to the bending displacement of the actuator element 12. When the displacement-transmitting section 46 contacts with the back surface of the optical waveguide plate 42, for example, the light 40, which has been subjected to total reflection in the optical waveguide plate 42, is transmitted through the back surface of the optical waveguide plate 42, and the light 40 is transmitted to the surface of the displacement-transmitting section 46. The light 40 is scattered and reflected by the surface of the displacement-transmitting section 46.

The displacement-transmitting section 46 is provided in order to scatter and reflect the light having been transmitted through the back surface of the optical waveguide plate 42, and in order to increase the area to contact with the optical waveguide plate 42 to be not less than a predetermined value. Namely, the light emission area is specified by the contact area between the displacement-transmitting section 46 and the optical waveguide plate 42.

The contact between the displacement-transmitting section 46 and the optical waveguide plate 42 means that the displacement-transmitting section 46 and the optical waveguide plate 42 are positioned with an intervening distance, if any, the distance being not more than a wavelength of the light 40 (light introduced into the optical waveguide plate 42).

On the other hand, the picture element 12, which is included in the group of the picture elements concerning the row selected by the vertical shift circuit and which is not subjected to ON selection or which is subjected to OFF selection, is operated as follows. Namely, the electric potential of the signal line 50 concerning the picture element 12 is made to be an electric potential which is different from the electric potential for ON selection, during the predetermined selected term Ts. A negative predetermined electric potential is applied to the first electrode 22a of the picture element 12, and a negative or positive electric potential is applied to the second electrode 22b. Thus the voltage between the pair of electrodes 22a, 22b is the predetermined voltage Vd in the negative or positive direction (see FIG. 27B).

At this time, as shown in FIG. 10B, for example, the electric field Ed in the negative or positive direction (for example, −0.6E to +0.6E) is generated between the pair of electrodes 22a, 22b, and the actuator element 12 corresponding to the picture element is displaced in the first direction in an amount of about −0.5 Δy to 1 Δy. As viewed for the display device, this state exhibits the OFF selection state. In the OFF selection state, the displacement-transmitting section 46 is separated from the optical waveguide plate 42 in accordance with the displacement action of the actuator element 12 as described above.

The actuator element 12 concerning the picture element subjected to ON selection or OFF selection undergoes the repolarization treatment in the NO selection state thereafter, and it makes displacement in an amount of about 1 Δy in the first direction (direction for the pair of electrodes 22a, 22b formed on the piezoelectric/electrostrictive layer 20 to face the free space). In the NO selection state, the voltage is at a level of Vg or Vf (see FIGS. 27A and 27B) which includes a superimposed voltage change brought about on the basis of ON selection or OFF selection in another row. However, the presence of the superimposed component (crosstalk component) effects a certain degree of the repolarization treatment for the actuator element 12 in the NO selection state. Accordingly, such a component is useful to restore the response performance for the displacement obtained in response to the change in electric field. Namely, the crosstalk component simultaneously contributes to the restoration of the response performance.

The voltage level to perform ON selection may be a voltage level at which an intense electric field is applied in the negative direction as compared with the voltage level Vb (voltage level corresponding to the electric field Eb (for example, −2E) in FIG. 10B). The voltage level to perform OFF selection may be any voltage level included in a voltage level range from Vc to Ve (voltage level range corresponding to an electric field range of Ec (for example, −0.6E) to Ee (+0.6E) in FIG. 10B). The voltage level to perform the repolarization treatment may be a voltage level at which an intense electric field is applied in the positive direction as compared with the voltage level Ve (voltage level corresponding to the electric field Ee (for example, +0.6E) in FIG. 10B).

Next, the operation of the display device according to the embodiment of the present invention will be explained. At first, the light 40 is introduced, for example, from the end of the optical waveguide plate 42. In this embodiment, all of the light 40 is subjected to total reflection at the inside of the optical waveguide plate 42 without being transmitted through the front and back surfaces of the optical waveguide plate 42 by controlling the magnitude of the refractive index of the optical waveguide plate 42.

In this state, when a certain actuator element 12 is allowed to be in the excited state, and the displacement-transmitting section 46 corresponding to the actuator element 12 contacts with the back surface of the optical waveguide plate 42 with a distance of not more than the wavelength of the light, if any, then the light 40, which has been subjected to total reflection, is transmitted to the surface of the displacement-transmitting section 46 which contacts with the back surface of the optical waveguide plate 42.

The light 40, which has once arrived at the surface of the displacement-transmitting section 46, is reflected by the surface of the displacement-transmitting section 46, and it behaves as scattered light 70 (see FIG. 20). A part of the scattered light 70 is reflected again in the optical waveguide plate 42. However, the greater part of the scattered light 70 is transmitted through the front surface of the optical waveguide plate 42 without being reflected by the optical waveguide plate 42.

Namely, the presence or absence of emission of light (leakage light) from the front surface of the optical waveguide plate 42 can be controlled in accordance with the presence or absence of the contact of the displacement-transmitting section 46 disposed at the back of the optical waveguide plate 42.

Especially, in the display device according to the embodiment of the present invention, one unit for making the displacement movement of the displacement-transmitting section 46 in the direction to make contact or separation with respect to the optical waveguide plate 42 is used as one picture element. Further, a large number of the picture elements are arranged in a matrix form or in a zigzag configuration concerning the respective rows. Accordingly, when the displacement movement of each of the picture elements is controlled in accordance with an attribute of an inputted image signal, a picture (for example, characters and patterns) can be displayed on the front surface of the optical waveguide plate in response to the image signal, in the same manner as the cathode-ray tube and the liquid crystal display device.

Next, explanation will be made for application of the display device according to the embodiment of the present invention to a color display system. At first, the principle of color development of the display device according to the embodiment of the present invention is specified by the mixing system of R (red), G (green), and B (blue) which are the three primary colors, in the same manner as the color display system in present use.

Figure 28A:
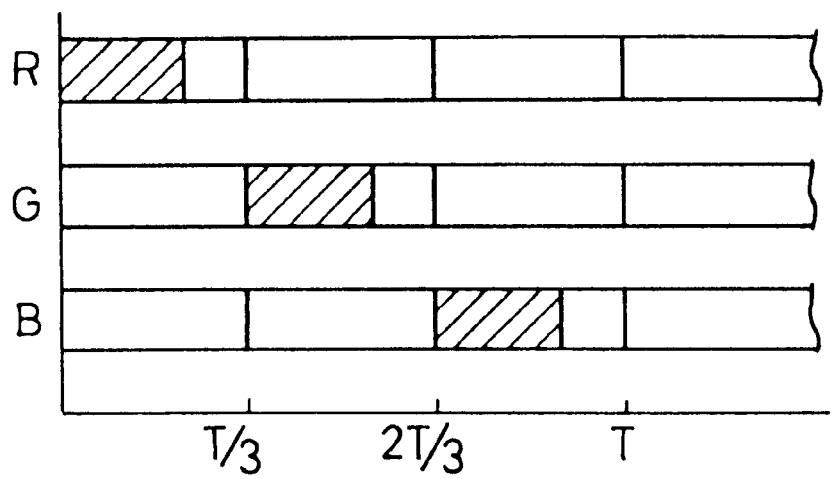
FIG. 28A shows a timing chart in which the ratio of RGB emission times is 1:1:1 when the display device according to the embodiment of the present invention is applied to a color display system.
Figure 28B:
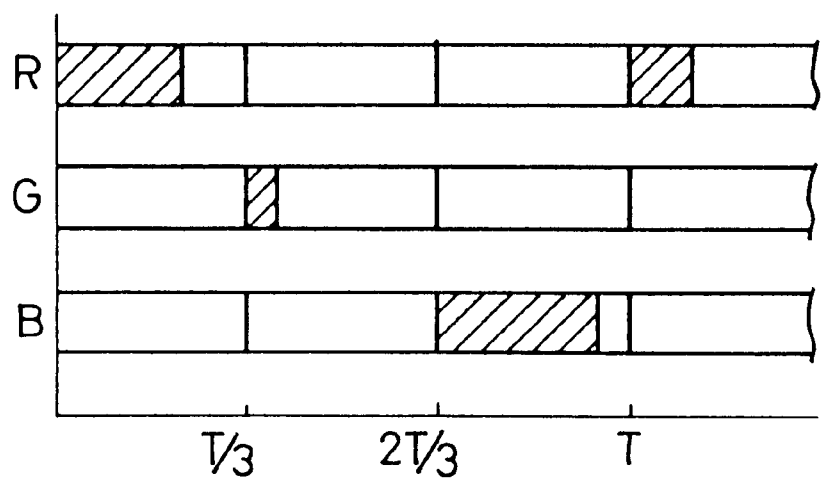
FIG. 28B shows a timing chart in which the ratio of RGB emission times is 4:1:5.

Now, it is assumed that the period of color development is T, in order to divide the maximum emission time of RGB into three. As shown in FIG. 28A, when the ratio of RGB emission times is 1:1:1, white light is obtained. As shown in FIG. 28B, when the ratio of RGB emission times is 4:1:5, an intermediate color corresponding to the ratio is obtained. Therefore, the time of color development may be controlled as follows. Namely, the emission times of the three primary colors are controlled, while the contact time between the optical waveguide plate 42 and the displacement-transmitting section 46 is synchronized with the period of color development T. Alternatively, the contact time between the optical waveguide plate 42 and the displacement-transmitting section 46 is controlled, while the emission times of the three primary colors are synchronized with the period of color development T.

In view of the foregoing facts, the display device according to the embodiment of the present invention is advantageous in that it is unnecessary to increase the number of picture elements as compared with the case of a white-and-black screen even when the display device is applied to the color display system.

Alternatively, the display device may be used such that color filters of R, G, B may be formed on the surface of the optical waveguide plate 42, or the plate members 46a of the displacement-transmitting sections 46 may be colored with R, G, B respectively. For example, it is possible to construct an apparatus by using unit actuators each corresponding to one picture element=R+G+B. Although the fineness is decreased, such an arrangement is advantageous in brightness and response time for ON/OFF (contact/separation). It is also possible to reduce the peak current and the electric power consumption.

Those adopted for coloring the plate member 46a of the displacement-transmitting section 46 include, for example, a method in which dyes or pigments of R, G, B are mixed with a material for the plate member 46a to form the colored member, and a method in which color filters of R, G, B are formed on the surface of the plate member 46a (surface opposing to the optical waveguide plate 42).

In the foregoing embodiment of the present invention, each of the picture elements 12 is subjected to the repolarization treatment during the non-selected term. Alternatively, the repolarization treatment may be performed by applying, for example, the same electric field as that used in the initial polarization treatment, during any one of three terms, i.e., a term ranging from the light emission completion point for R to the next light emission start point for G, a term ranging from the light emission completion point for G to the next light emission start point for B, and a term ranging from the light emission completion point for B to the next light emission start point for R. In this procedure, the repolarization treatment may be combined with the repolarization treatment performed during the non-selected term.

Those preferably used as a light source for the illumination light to be introduced into the optical waveguide plate 42 include, for example, RGB light sources such as fluorescent light tubes, light emitting diodes, and laser beams. Switching of R, G, B can be achieved by utilizing a mechanical shutter or an ON/OFF switch. Alternatively, it is preferable to adopt a combination of R, G, B color filters with a white light source such as a fluorescent light tube, a halogen lamp, and a xenon lamp.

Figure 29:
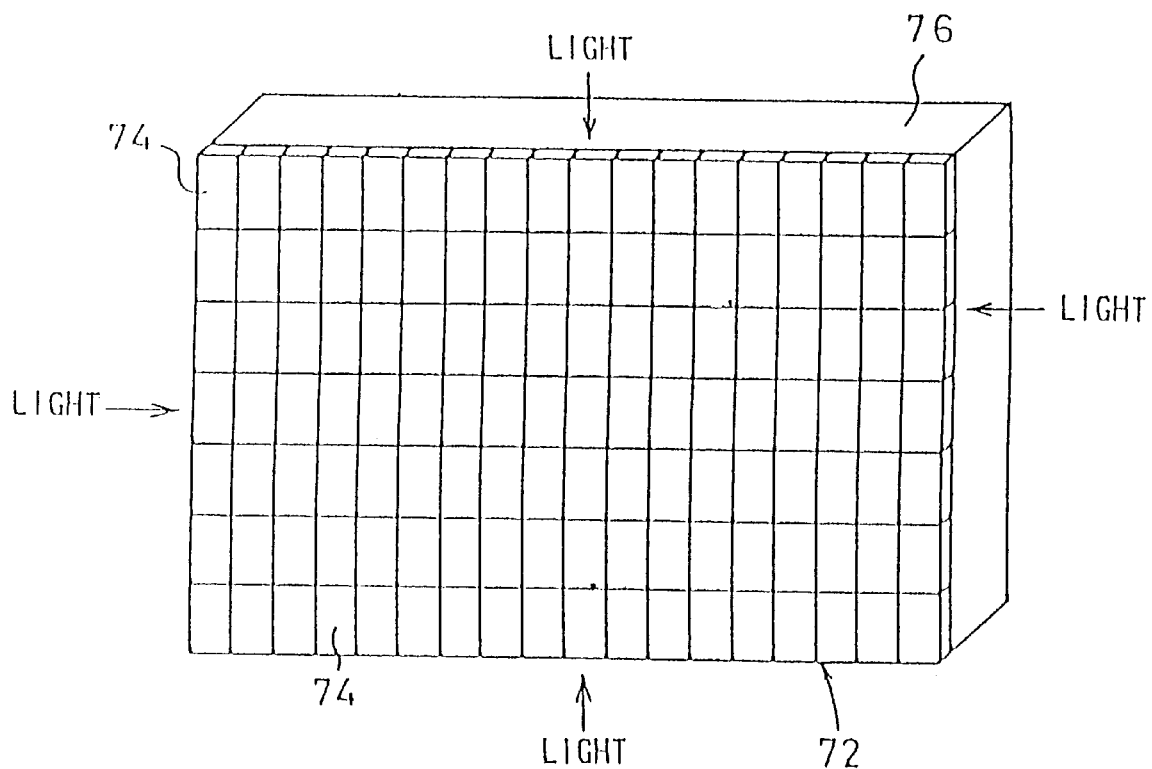
FIG. 29 shows a perspective view illustrating a large screen display apparatus based on the use of the display devices according to the embodiment of the present invention, as viewed from a back side.
Figure 30:
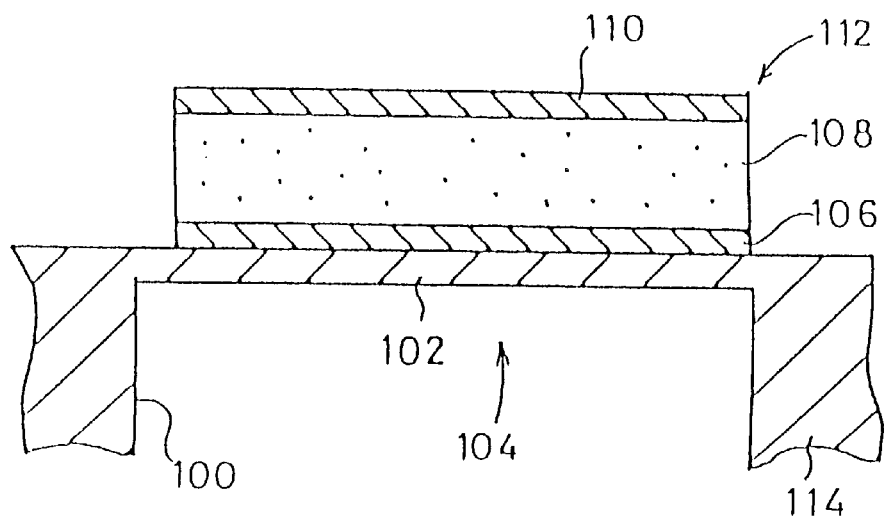
FIG. 30 shows a cross-sectional view illustrating an illustrative conventional piezoelectric/electrostrictive element.
Figure 31A:
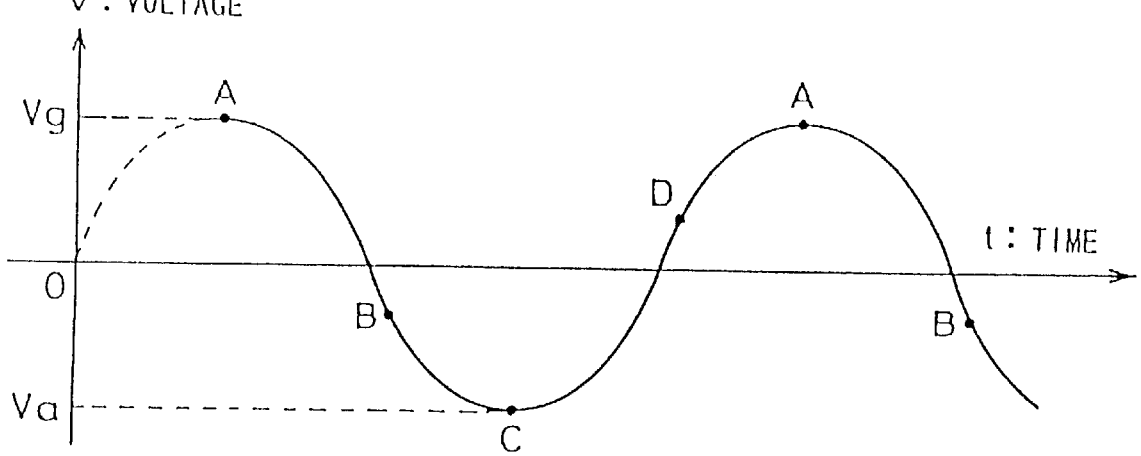
FIG. 31A shows a timing chart illustrating an electric potential waveform to be applied to upper and lower electrodes in order to measure a bending displacement characteristic of the illustrative conventional piezoelectric/electrostrictive element.
Figure 31B:
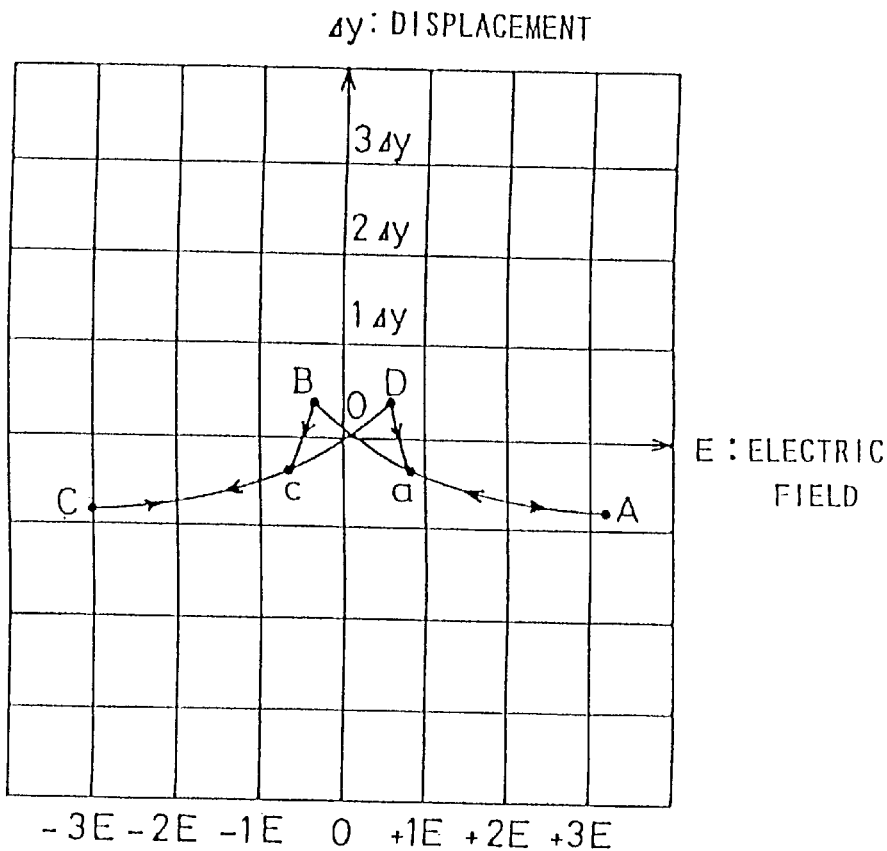
FIG. 31B shows a characteristic curve illustrating the bending displacement characteristic of the illustrative conventional piezoelectric/electrostrictive element.
Figure 32A:
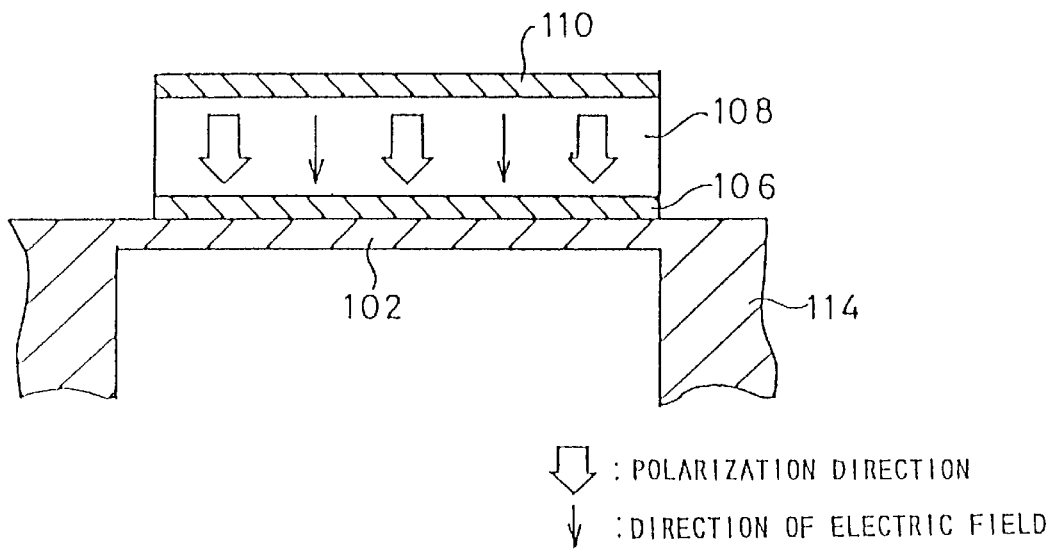
FIG. 32A explanatorily shows a polarization direction and a direction of an electric field obtained in a state in which the electric field (+3E) is applied in the positive direction to the illustrative conventional piezoelectric/electrostrictive element.
Figure 32B:
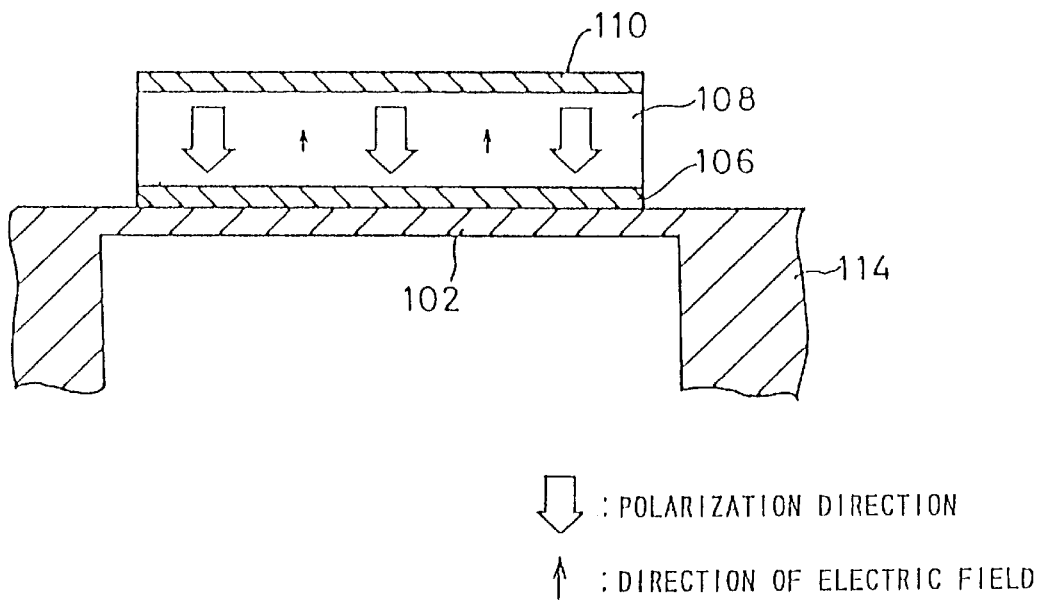
FIG. 32B explanatorily shows a polarization direction and a direction of an electric field obtained in a state in which the predetermined electric field (−0.5E) in the negative direction is applied to the piezoelectric/electrostrictive element.

The display device according to the embodiment of the present invention can be used singly. Besides, the display device according to the embodiment of the present invention may be used as one display element 74 included in a large screen display apparatus 72 as shown in FIG. 29. FIG. 29 shows an illustrative arrangement in which seven display elements 74 are arranged in the vertical direction, and eighteen display elements 74 are arranged in the lateral direction on a back surface of a light-introducing plate 76 having a display area for a large screen. In this arrangement, those which have a large and uniform light transmittance in the visible light region, such as glass plates and acrylic plates are used for the light-introducing plate 76. The respective display elements 74 are connected to one another by means of, for example, wire bonding, soldering, face connector, and back connector so that signals may be mutually supplied.

The large screen display apparatus 72 shown in FIG. 29 uses, for example, the display devices as shown in FIG. 24, as the display devices applied to the respective display elements 74. In each of the display elements 74, the arrangement of the picture elements 12 comprises 32 individuals in the horizontal direction and 32 individuals in the vertical direction. In the display device shown in FIG. 24, the picture elements 12 concerning the respective rows are arranged in the zigzag form. Accordingly, it is possible to provide an extremely small arrangement pitch of the picture elements 12 in the horizontal direction. When the number of arranged picture elements in the horizontal direction is the same as that in the vertical direction, the entire planar configuration has a vertical length which is longer than a horizontal length.

The large screen display apparatus 72 shown in FIG. 29 represents the illustrative arrangement in which the display elements 74 including the optical waveguide plates 42 are arranged in the matrix form on the plate surface of the large light-introducing plate 76. Alternatively, the large light-introducing plate 76 may be omitted so that the large screen display apparatus 72 is constructed by arranging, in a matrix form, the display elements 74 including the optical waveguide plates 42. In such an arrangement, the large number of optical waveguide plates 42 arranged in the matrix form also serve as the large light-introducing plate 76. Besides the foregoing arrangement, it is also allowable that the large screen display apparatus 72 is constructed by arranging, in a matrix form, display elements 74 without including any optical waveguide plate 42 on the plate surface of the large light-introducing plate 76.

It is preferable that the light-introducing plate 76 has a refractive index which is similar to that of the optical waveguide plate 42. When the light-introducing plate 76 and the optical waveguide plates 42 are stuck to one another, a transparent adhesive may be used. The adhesive preferably has a uniform and high transmittance in the visible light region, in the same manner as the optical waveguide plate 42 and the light-introducing plate 76. It is desirable for the adhesive to set a refractive index which is near to those of the light-introducing plate 76 and the optical waveguide plate 42 in order to ensure brightness of the screen.

In the display device according to the embodiment of the present invention, since the main actuator element 24 for selectively displacing the displacement-transmitting section 46 is constructed such that the pair of electrodes 22a, 22b are formed on the side of the first principal surface of the piezoelectric/electrostrictive layer 20 formed on the vibrating section 16, air or the constitutive material for the displacement-transmitting section 46, which has an extremely small dielectric constant as compared with the piezoelectric/electrostrictive layer 20, is allowed to intervene between the pair of electrodes 22a, 22b.

For this reason, the electrostatic capacity of the main actuator element 24 is smaller than those in which electrodes are formed on upper and lower surfaces of the piezoelectric/electrostrictive layer 20. Accordingly, the CR time constant for signal transmittance is also small. Namely, rounding scarcely occurs in the signal waveform of the voltage signal corresponding to the attribute of the image signal.

Accordingly, it is possible to selectively apply a specified voltage between the pair of electrodes 22a, 22b of each of the picture elements 12, making it possible to give necessary elongation to the respective piezoelectric/electrostrictive layers 20. Especially, it is possible to suppress the phenomenon that the display brightness is weakened at portions corresponding to the actuator elements 12 arranged at positions far from the portion from which the voltage signal is supplied (for example, peripheral and central portions of the screen).

Namely, the display device according to the embodiment of the present invention has an advantage that the electrostatic capacity of the actuator element 12 can be reduced, in addition to the advantage that it is unnecessary to increase the number of picture elements as compared with the black-and-white screen even when the display device is applied to the color display system. Further, it is possible to obtain the display brightness without any nonuniformity when a white color is displayed on the entire surface of a display screen, and it is possible to improve the image quality.

Especially, as shown in FIGS. 4 and 5, the display device according to the embodiment of the present invention has the pattern in which the first electrodes 22a of the pairs of electrodes 22a, 22b, which communicate with the vertical selection line 48, are connected in series concerning one row. Accordingly, it is possible to provide a wide dimension of the outer circumferential portion of each of the first electrodes 22a (shown by broken lines). In such an arrangement; it is possible to decrease the wiring resistance of the vertical selection line 48, and thus the CR time constant for signal transmission can be further decreased.

In the display device according to the embodiment of the present invention, the displacement direction of the actuator element 12 is directed upwardly as shown in FIGS. 2 and 20 (direction toward the optical waveguide plate 42). Accordingly, the displacement-transmitting section 46 can be pressed against the optical waveguide plate 42 by means of the displacement force of the actuator element 12. Moreover, it is easy to adjust the clearance (gap) between the optical waveguide plate 42 and the actuator element 12. Therefore, the display device is advantageous in that the displacement-transmitting section 46 reliably contacts with the optical waveguide plate 42.

In the case of the display device according to the embodiment of the present invention, if a part of the piezoelectric/electrostrictive layer 20 is lost together with a part of the electrode 22a, 22b disposed thereon due to dielectric breakdown or the like during production steps, for example, the actuator element 12 sufficiently functions only by repairing the lost electrode 22a, 22b even when the piezoelectric/electrostrictive layer 20 is not repaired. Accordingly, it is possible to eliminate vain efforts such as reproduction of an entire device during production steps, and it is possible to achieve improvement in yield of the display device.

In the display device according to the embodiment of the present invention, the vibrating section 16 and the fixed section 18 are formed in an integrated manner with the substrate 10 (ceramic), and the recess 14 is formed at the position corresponding to the vibrating section 16 so that the vibrating section 16 is thin-walled. Therefore, it is easy to produce the fixed section 18 and the vibrating section 16 in the substrate 10, which is advantageous in that the production cost for the display device can be reduced.

The thick-walled fixed section 18 and the thin-walled vibrating section 16 are consequently formed by providing the recess 14 in the substrate 10 composed of ceramic. Therefore, the vibrating section 16 responds to elongation of the piezoelectric/electrostrictive layer 20 in a sensitive manner. Thus the vibrating section 16 can promptly follow any change in voltage signal. Further, the rigidity is sufficiently ensured at the boundary between the vibrating section 16 and the fixed section 18, as compared with actuator elements having a bridged structure or a cantilever structure. Therefore, breakage scarcely occurs due to fatigue of the boundary caused by vibration of the vibrating section 16. In addition, the high rigidity of the substrate 10 and the vibrating section 16 makes it easy to stick the optical waveguide plate 42 to the driving unit 44.

In the display device according to the present invention, both of the recess 14 and the piezoelectric/electrostrictive layer 20 have smoothly cornered planar configurations respectively, and the planar configuration of the recess 14 has a size larger than that of the piezoelectric/electrostrictive layer 20. Therefore, the boundary between the vibrating section 16 and the fixed section 18 has a smoothly cornered configuration in the same manner as the planar configuration of the recess 14. Accordingly, the stress, which is generated by vibration of the vibrating section 16, is not locally concentrated.

Moreover, all of the circumferential edge of the vibrating section 16 is supported by the fixed section 18, and hence it is possible to increase the rigidity at the circumferential edge portions of the vibrating section 16. As a result, it is possible to greatly improve the fatigue limit or endurance limit at the boundary, it is possible to realize a long service life of the actuator element 12, and consequently it is possible to realize a long service life of the display device.

In the display device according to the embodiment of the present invention, the pair of electrodes 22a, 22b on the piezoelectric/electrostrictive layer 20 are subjected to wiring in a planar form to have a spiral configuration in which the pair of electrodes 22a, 22b are arranged in parallel to one another and separated from each other. Therefore, when a predetermined voltage is applied between the pair of electrodes 22a, 22b, an electric field is generated radially (isotropically) around the first principal surface of the piezoelectric/electrostrictive layer 20. Accordingly, elongation occurs radially (isotropically) at the first principal surface of the piezoelectric/electrostrictive layer 20. Simultaneously, contraction occurs radially (isotropically) at deep portions in the piezoelectric/electrostrictive layer 20. Therefore, the piezoelectric/electrostrictive layer 20 efficiently makes displacement so that its central portion is convex. Moreover, dispersion in displacement is decreased among the respective picture elements 12.

When the pair of electrodes 22a, 22b on the piezoelectric/electrostrictive layer 20 have a branched planar configuration, displacement occurs as follows. Namely, when a predetermined voltage is applied between the pair of electrodes 22a, 22b, elongation occurs radially (isotropically) at the first principal surface of the piezoelectric/electrostrictive layer 20, and contraction occurs radially (isotropically) at deep portions in the piezoelectric/electrostrictive layer 20. Therefore, the piezoelectric/electrostrictive layer 20 efficiently makes displacement so that its central portion is convex. Further, dispersion in displacement is decreased among the respective picture elements 12.

Especially, in the case of the display device shown in FIGS. 5 and 22, the electrode is divided into the trunk 26, 28 and the branches 30, 32. Therefore, even if a part of the piezoelectric/electrostrictive layer 20, for example, a part of the piezoelectric/electrostrictive layer 20 corresponding to any branch 30, 32 is lost together with the branch 30, 32 due to dielectric breakdown or the like, the other parts are extremely scarcely affected thereby. The actuator element 12 sufficiently functions as long as the trunk 26, 28 remains. It is a matter of course that the original function before the loss can be restored only by repairing the lost branch 26, 28 of the electrode. Accordingly, it is possible to realize easy maintenance for the display device.

In the display device according to the embodiment of the present invention, those used as the optical waveguide plate 42 have a high flatness and a high smoothness at the both surfaces. Alternatively, it is also possible to use a plate of so-called ground glass having a back surface treated to be rough. In this embodiment, the first surface of the displacement-transmitting section 46 (surface opposed to the back surface of the ground glass plate) is treated to be rough corresponding to the rough surface configuration of the back surface of the ground glass plate. Alternatively, the first surface portion of the displacement-transmitting section 46 is constructed by using an elastomer having a relatively low viscosity.

In such an arrangement, at first, the light coming from the front is reflected by the rough surface of the ground glass plate, and the light is transmitted as scattered light toward the front surface of the ground glass plate. In this state, when a certain actuator element 12 is made to be in the excited state, and the displacement-transmitting section 46 corresponding to the actuator element 12 contacts with the back surface of the ground glass plate, then a situation occurs in which the rough surface portion corresponding to the contact portion is counteracted by the rough surface of the displacement-transmitting section 46 or elastic deformation of the displacement-transmitting section 46. Accordingly, the light, which has been reflected by the rough surface portion of the ground glass plate, is transmitted through the displacement-transmitting section 46 contacting with the back surface of the ground glass plate.

Namely, when the ground glass plate is used as the optical waveguide plate 42, the presence or absence of light emission at the front surface of the ground glass plate can be controlled depending on the presence or absence of contact of the displacement-transmitting section 46 located at the back surface of the ground glass plate. Thus it is possible to obtain the same effect as that provided by the display device according to the embodiment of the present invention. Especially, when the ground glass plate is used, any illumination means for actively introducing light into the ground glass plate is unnecessary. Accordingly, the arrangement is more simplified.

Description has been made in the illustrative embodiments in which the piezoelectric/electrostrictive element according to the present invention is applied to the display device. However, the present invention is also applicable to filters, various sensors such as ultrasonic sensors, angular velocity sensors, acceleration sensors, and shock sensors, microphones, sounding bodies (speakers or the like), discriminators, and vibrators, resonators, and oscillators for power generation and communication. The present invention is also applicable to actuators to be used for, for example, servo displacement elements, pulse driving motors, ultrasonic motors, and piezoelectric fans.

The illustrative embodiments of the piezoelectric/electrostrictive element according to the present invention and the embodiments in which the piezoelectric/electrostrictive element is applied to the display device have been specifically explained. However, the present invention should not be interpreted such that it is limited to the illustrative embodiments and the display device according to the embodiments. It is possible to apply, to the present invention, various changes, modifications, and improvements without deviating from the scope of the present invention.

What is claimed is:

1. A piezoelectric/electrostrictive element composed of a main piezoelectric/electrostrictive element of a uni-morph type comprising:

a piezoelectric/electrostrictive operating section including a piezoelectric/electrostrictive layer and a pair of electrodes formed on a first principal surface of said piezoelectric/electrostrictive layer;

a vibrating section which contacts with a second principal surface of said piezoelectric/electrostrictive layer for supporting said piezoelectric/electrostrictive operating section; and a fixed section for supporting said vibrating section in a vibrative manner, said fixed section having a window formed therethrough that is closed by said vibrating section, wherein:

a relationship of y=ax is satisfied, and an expression of $\frac{1}{10} \leq a \leq 100$ is satisfied provided that x represents a distance between said pair of electrodes and ranges from 1 μm to 200 μm, and y represents a thickness of said piezoelectric/electrostrictive layer and ranges from 1 μm to 100 μm.

2. The piezoelectric/electrostrictive element according to claim 1, wherein:

said vibrating section and said fixed section are formed from ceramics in an integrated manner; and said window is formed at a portion corresponding to said vibrating section so that said vibrating section is thin-walled.

3. The piezoelectric/electrostrictive element according to claim 1, wherein an expression of $1/5 \leq a \leq 10$ is satisfied.

4. The piezoelectric/electrostrictive element according to claim 1, wherein an expression of $1/2 \leq a \leq 5$ is satisfied, and expressions of $1\ \mu m \leq x \leq 60\ \mu m$ and $1\ \mu m \leq y \leq 40\ \mu m$ are satisfied.

5. The piezoelectric/electrostrictive element according to claim 1, wherein a relationship of $y=bz$ is satisfied, and an expression of $1/5 \leq b \leq 10$ is satisfied provided that z represents a thickness of said vibrating section and ranges from 1 μm to 50 μm.

6. The piezoelectric/electrostrictive element according to claim 5, wherein an expression of $1/3 \leq b \leq 5$ is satisfied.

7. The piezoelectric/electrostrictive element according to claim 1, wherein an expression of $1/3 \leq b \leq 5$ is satisfied, and expressions of $1\ \mu m \leq y \leq 40\ \mu m$ and $1\ \mu m \leq z \leq 20\ \mu m$ are satisfied.

8. The piezoelectric/electrostrictive element according to claim 1, wherein said piezoelectric/electrostrictive layer has a protrusion in the vicinity of its center that extends in a direction away from said vibrating section.

9. The piezoelectric/electrostrictive element according to claim 8, wherein said piezoelectric/electrostrictive layer has an indentation positioned on each side of said protrusion, and the following relationship is satisfied:

$$m/1000 \leq t \leq m/10$$

wherein m is the shortest width dimension of said window, measured in a plane generally parallel to the plane of said piezoelectric/electrostrictive element, and t is the height of said protrusion, measured from a reference line drawn between the bottoms of said indentations.

10. The piezoelectric/electrostrictive element according to claim 8, wherein said piezoelectric/electrostrictive layer has one indentation on one side of said protrusion, and the following relationship is satisfied:

$$m/1000 \leq t \leq m/10$$

wherein m is the shortest width dimension of said window, measured in a plane generally parallel to the plane of said piezoelectric/electrostrictive element, and t is the height of said protrusion measured from a reference line drawn between the bottom of said indentation and a fixing point, on the other side of said protrusion, where said vibrating section is attached to said fixed section.

11. The piezoelectric/electrostrictive element according to claim 8, wherein the following relationship is satisfied:

$$m/1000 \leq t \leq m/10$$

wherein m is the shortest width dimension of said window, measured in a plane generally parallel to the plane of said piezoelectric/electrostrictive element, and t is the height of said protrusion measured from a reference line drawn between fixing points, arranged on each side of said protrusion, where said vibrating section is attached to said fixed section.

* * * * *